(12) United States Patent
Aoki

(10) Patent No.: US 8,354,962 B2
(45) Date of Patent: Jan. 15, 2013

(54) ANTENNA AND MANUFACTURING METHOD THEREOF, SEMICONDUCTOR DEVICE INCLUDING ANTENNA AND MANUFACTURING METHOD THEREOF, AND RADIO COMMUNICATION SYSTEM

(75) Inventor: Tomoyuki Aoki, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 1177 days.

(21) Appl. No.: 11/604,583

(22) Filed: Nov. 27, 2006

(65) Prior Publication Data

US 2007/0122960 A1    May 31, 2007

(30) Foreign Application Priority Data

Nov. 29, 2005    (JP) ................. 2005-343012

(51) Int. Cl.
*H01Q 1/38* (2006.01)
(52) U.S. Cl. ................. 343/700 MS; 343/895
(58) Field of Classification Search ........... 343/700 MS, 343/878, 895
See application file for complete search history.

(56) References Cited

U.S. PATENT DOCUMENTS

| | | | |
|---|---|---|---|
| 5,132,248 A | | 7/1992 | Drummond et al. |
| 6,294,401 B1 | | 9/2001 | Jacobson et al. |
| 6,422,473 B1 | | 7/2002 | Ikefuji et al. |
| 7,492,164 B2 * | | 2/2009 | Hanhikorpi et al. ........... 324/633 |
| 7,683,473 B2 * | | 3/2010 | Kasai et al. .................... 257/698 |
| 7,767,516 B2 * | | 8/2010 | Aoki et al. ..................... 438/238 |
| 2004/0147113 A1 | | 7/2004 | Yamazaki et al. |
| 2004/0164302 A1 | | 8/2004 | Arai et al. |
| 2005/0130389 A1 | | 6/2005 | Yamazaki et al. |
| 2005/0133605 A1 | | 6/2005 | Koyama et al. |
| 2005/0135181 A1 | | 6/2005 | Shionoiri et al. |
| 2005/0148121 A1 | | 7/2005 | Yamazaki et al. |
| 2008/0001825 A1 * | | 1/2008 | Kurokawa et al. ..... 343/700 MS |

FOREIGN PATENT DOCUMENTS

| | | |
|---|---|---|
| EP | 0 992 366 A1 | 4/2000 |
| JP | 04-213833 | 8/1992 |
| JP | 4-213833 | 8/1992 |
| JP | 08-112682 | 5/1996 |
| JP | 10-193848 | 7/1998 |

(Continued)

OTHER PUBLICATIONS

International Search Report, PCT application No. PCT/JP2006/323533, dated Feb. 27, 2007.

(Continued)

*Primary Examiner* — Tan Ho
(74) *Attorney, Agent, or Firm* — Husch Blackwell LLP

(57) ABSTRACT

An antenna includes a first substrate, a first pattern, a second substrate, a second pattern, and an anisotropic conductive material. The first substrate has an insulating surface. The first pattern is formed over the insulating surface of the first substrate, and made of a conductive material. The second substrate is provided so as to face the surface over which the first pattern of the first substrate is formed and has an insulating surface. The second pattern is formed over the insulating surface facing the first substrate of the second substrate, and made of a conductive material. The anisotropic conductive material electrically connects the first pattern and the second pattern. The whole region of the first pattern overlaps with the second pattern with the anisotropic conductive material interposed therebetween.

28 Claims, 14 Drawing Sheets

FOREIGN PATENT DOCUMENTS

| | | |
|---|---|---|
| JP | 2000-113147 | 4/2000 |
| JP | 2000-339437 | 12/2000 |
| JP | 2002-049899 | 2/2002 |
| JP | 2002-183696 | 6/2002 |
| JP | 2002-259934 | 9/2002 |
| JP | 2004-362190 | 12/2004 |
| JP | 2005-183741 | 7/2005 |
| JP | 2005-202943 | 7/2005 |
| JP | 2005-229098 | 8/2005 |
| WO | WO 2005/057658 A1 | 6/2005 |
| WO | WO 2005/119781 A1 | 12/2005 |

OTHER PUBLICATIONS

Written Opinion, PCT application No. PCT/JP2006/323533, dated Feb. 27, 2007.

* cited by examiner

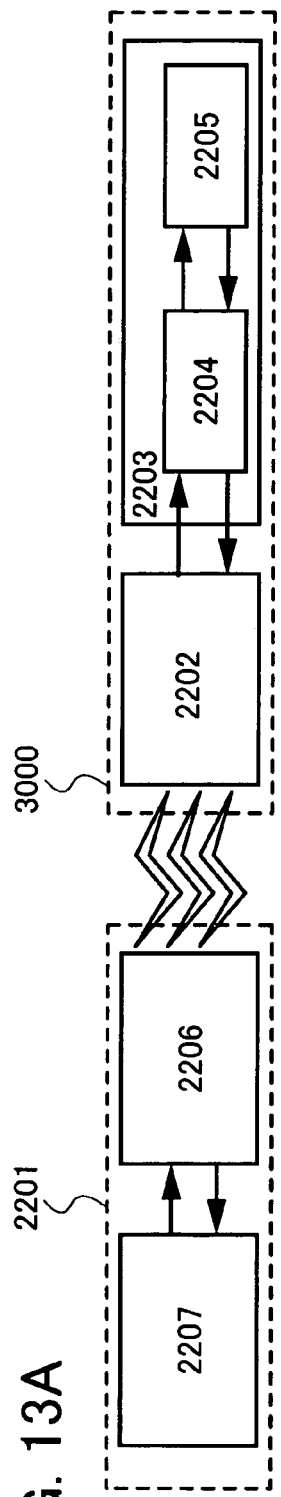
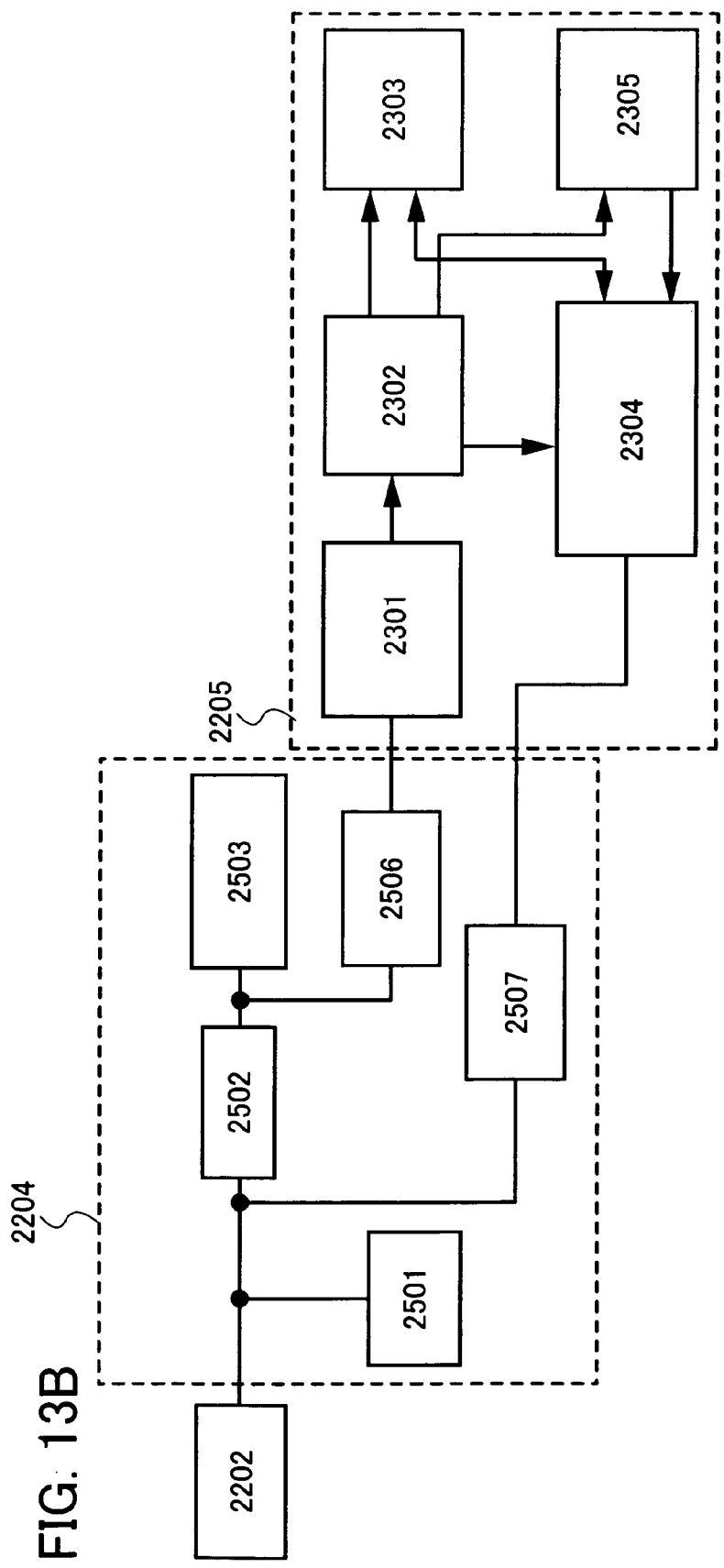
FIG. 13A
FIG. 13B

ANTENNA AND MANUFACTURING METHOD THEREOF, SEMICONDUCTOR DEVICE INCLUDING ANTENNA AND MANUFACTURING METHOD THEREOF, AND RADIO COMMUNICATION SYSTEM

TECHNICAL FIELD

The present invention relates to an antenna and a manufacturing method thereof. The invention also relates to a semiconductor device which includes an antenna and a semiconductor integrated circuit electrically connected to the antenna, and inputs/outputs data by radio communication through the antenna. In addition, the invention relates to a radio communication system including the semiconductor device and a reader/writer which inputs/outputs data by radio communication.

BACKGROUND ART

Identification technology where an ID (identification number) is assigned to an individual object so as to clarify the history thereof, which is utilized for production, management, and the like has been attracting attention. Above all, RFID (Radio Frequency Identification) technology using a semiconductor device for inputting/outputting data through radio communication, such as a radio tag (also referred to as an IC tag, an IC chip, an RF (Radio Frequency) tag, an RFID, an RFID tag, an electronic tag, or a transponder), has started to be employed. Such a semiconductor device for inputting/outputting data by radio communication includes an antenna and a semiconductor integrated circuit electrically connected to the antenna.

An antenna can be formed over a film formed of plastic or the like by screen printing using a conductive paste. An antenna which is formed by screen printing and has a plated surface has been suggested (see Patent Document 1). Further, a coiled antenna is formed for each of a planarity of substrates by screen printing, and the coiled antennas of the plurality of substrates are arranged so as to overlap with each other and electrically connected in series. Such a configuration where a coiled antenna with many coils is employed has been suggested (see Patent Document 2).

[Patent Document 1] Japanese Published Patent Application No. 2000-113147
[Patent Document 2] Japanese Published Patent Application No. 2002-183696

DISCLOSURE OF INVENTION

It is difficult to increase a thickness of an antenna formed by screen printing, as well as reduce resistance thereof. In addition, it is difficult to improve the yield. Note that a method where the surface of an antenna is plated has more steps, which costs more. In addition, the plating method has a limit to increase film thickness of an antenna. In the case of employing a configuration where coiled antennas of the plurality of substrates are arranged so as to overlap with each other and electrically connected in series, it is difficult to reduce resistance of an antenna. This is because the configuration is not for increasing a cross-sectional area of a wire included in an antenna although a coiled antenna with many coils can be obtained. Further, if even one of a plurality of coiled antennas is partially disconnected, the plurality of antennas does not function normally.

Thus, a conventional antenna has difficulty being reduced in resistance and improved in the yield. Therefore, a conventional semiconductor device for inputting/outputting data by radio communication with the antenna has difficulty having longer communication distance and higher reliability, and being reduced in cost.

In view of the aforementioned conditions, the invention provides an antenna with low resistance and high yield, and a manufacturing method thereof. Further, the invention provides a semiconductor device having longer communication distance and high reliability with the antenna, and a manufacturing method thereof.

An antenna of the invention includes a first substrate, a first pattern, a second substrate, a second pattern, and an anisotropic conductive material. The first substrate has an insulating surface. The first pattern is formed of a conductive material, over the insulating surface of the first substrate (hereinafter also referred to as a first insulating surface). The second substrate is provided so as to face the surface of the first substrate over which the first pattern is formed, and has an insulating surface (hereinafter also referred to as a second insulating surface). The second pattern is formed of a conductive material, over the insulating surface facing the first substrate (the second insulating surface) of the second substrate. The anisotropic conductive material is provided between the first pattern and the second pattern and electrically connects the first pattern and the second pattern. The first pattern and the second pattern are arranged so that in the case where one of the first pattern and the second pattern is partially disconnected (or partially defective), the other and the anisotropic conductive film electrically connects a disconnected portion. For example, the first pattern and the second pattern are electrically connected to each other through the anisotropic conductive material at arbitrary two portions other than a pair of electrodes for being connected to a semiconductor integrated circuit or the like. For example, the first pattern and the second pattern have the same shape and are arranged so as to overlap with each other. For another example, the whole region of the first pattern overlaps with the second pattern with the anisotropic conductive material interposed therebetween. Note it may be that the whole region of the second pattern overlaps with the first pattern with the anisotropic conductive material interposed therebetween. Further, the anisotropic conductive material may be arranged so as to cover all over the first insulating surface or the second insulating surface.

An application of the invention is not limited to an antenna, and can be applied to a wiring having an arbitrary shape.

The invention may be a semiconductor device which includes an antenna having the aforementioned configuration and a semiconductor integrated circuit electrically connected to the antenna, and inputs/outputs data by radio communication through the antenna. Note that the semiconductor integrated circuit may be electrically connected to the antenna through a contact hole penetrating through the first substrate to reach the first pattern or a contact hole penetrating through the second substrate to reach the second pattern.

The invention may be a radio communication system having the semiconductor device and a reader/writer for inputting/outputting data to/from the semiconductor device.

A manufacturing method of an antenna of the invention is as follows. The first pattern is formed of a conductive material, over the insulating surface of the first substrate (the first insulating surface). The second pattern is formed of a conductive material, over the insulating surface of the second substrate (the second insulating surface). The anisotropic conductive material is formed so as to cover all over the first pattern. The first substrate and the second substrate are attached to each other so that the first pattern and the second pattern are electrically connected through the anisotropic conductive material and the whole region of the first pattern overlaps with the second pattern. Note that the second pattern may be formed over the insulating surface of the second substrate (the second insulating surface) so as to be axisymmetric with the first pattern that is seen from a direction perpendicular to the insulating surface of the first substrate (the first insulating surface). In other words, the second pattern may be formed so that the first pattern that is seen from a direction perpendicular to the first insulating surface and the second pattern that is seen from a direction perpendicular to the second insulating surface are axisymmetrical. Further, the anisotropic conductive material may be formed so as to cover all over the first pattern and the insulating surface of the first substrate.

An application of the invention is not limited to a manufacturing method of an antenna, and can be applied to a manufacturing method of a wiring having an arbitrary shape.

A manufacturing method of a semiconductor device of the invention is as follows. The first pattern is formed of a conductive material, over the insulating surface of the first substrate (the first insulating surface). The second pattern is formed of a conductive material, over the insulating surface of the second substrate (the second insulating surface). The anisotropic conductive material is formed so as to cover all over the first pattern. The first substrate and the second substrate are attached to each other so that the first pattern and the second pattern are electrically connected through the anisotropic conductive material and the whole region of the first pattern overlaps with the second pattern. A semiconductor integrated circuit is provided so as to be electrically connected to the first pattern or the second pattern. Note that the second pattern may be formed over the insulating surface of the second substrate (the second insulating surface) so as to be axisymmetric with the first pattern that is seen from a direction perpendicular to the insulating surface of the first substrate (the first insulating surface). In other words, the second pattern may be formed so that the first pattern that is seen from a direction perpendicular to the first insulating surface and the second pattern that is seen from a direction perpendicular to the second insulating surface are axisymmetrical. Further, the anisotropic conductive material may be formed so as to cover all over the first pattern and the insulating surface of the first substrate.

Another manufacturing method of a semiconductor device of the invention is as follows. The first pattern is formed of a conductive material, over the insulating surface of the first substrate (the first insulating surface). The second pattern is formed of a conductive material, over the insulating surface of the second substrate (the second insulating surface). The contact hole penetrating through the first substrate to reach the first pattern or the contact hole penetrating through the second substrate to reach the second pattern is formed. The anisotropic conductive material is formed so as to cover all over the first pattern. The first substrate and the second substrate are attached to each other so that the first pattern and the second pattern are electrically connected through the anisotropic conductive material and the whole region of the first pattern overlaps with the second pattern. A semiconductor integrated circuit is provided so as to be electrically connected to the first pattern or the second pattern through the contact hole. Note that the second pattern may be formed over the insulating surface of the second substrate (the second insulating surface) so as to be axisymmetric with the first pattern that is seen from a direction perpendicular to the insulating surface of the first substrate (the first insulating surface). In other words, the second pattern may be formed so that the first pattern that is seen from a direction perpendicular to the first insulating surface and the second pattern that is seen from a direction perpendicular to the second insulating surface are axisymmetrical. Further, the anisotropic conductive material may be formed so as to cover all over the first pattern and the insulating surface of the first substrate.

In the manufacturing method of an antenna of the invention and that of a semiconductor device of the invention, the first pattern and the second pattern may be formed by a droplet discharging method or a printing method. A droplet discharging method is a method in which droplets of a predetermined composition are discharged from fine pores to form a predetermined pattern. A droplet discharging method is also referred to as an ink-jet method depending on its system. A printing method refers to screen printing and offset printing.

In the case of an antenna of the invention, the whole region of the first pattern overlaps with the second pattern with the anisotropic conductive material interposed therebetween. Therefore, the antenna materially has a film thickness that is a total of the first pattern and the second pattern. Thus, the antenna can be increased in film thickness materially and reduced in resistance. Further, if the first pattern is partially disconnected, the disconnected portion can be electrically connected by the second pattern, hence probability of the antenna being entirely disconnected can be reduced. Accordingly, the yield of the antenna can be improved.

Alternatively, an antenna of the invention may have a structure where the whole region of the first pattern overlaps with the second pattern with the anisotropic conductive material interposed therebetween and the whole region of the second pattern overlaps with the first pattern with the anisotropic conductive material interposed therebetween. In the case of this configuration, the patterns having the same shape overlap with each other with the anisotropic conductive material interposed therebetween. Therefore, if one of the first pattern and the second pattern is partially disconnected, the disconnected portion can be electrically connected by the other pattern, hence probability of the antenna being entirely disconnected can be reduced. Accordingly, the yield of the antenna can be improved.

The anisotropic conductive material may be arranged so as to cover all over the first insulating surface and the second insulating surface. Thus, the antenna is provided in a region surrounded by the first substrate, the second substrate, and the anisotropic conductive material. Thus, not exposed outside, the antenna can be protected from an impact from outside. In addition, the antenna can be prevented from corroding or the like due to exposure to ambient air. Accordingly, the antenna can be reduced in deterioration and increased in reliability.

An antenna of the invention can have low resistance, high yield, and high reliability. Therefore, by applying the invention to a semiconductor device which includes an antenna and a semiconductor integrated circuit electrically connected to the antenna and which inputs/outputs data by radio communication through the antenna, the semiconductor device can have longer communication distance and higher reliability, and be reduced in cost.

The semiconductor integrated circuit may be electrically connected to the antenna in the contact hole penetrating through the first substrate to reach the first pattern or the contact hole penetrating through the second substrate to reach the second pattern. Thus, the antenna can be prevented from being exposed to the outside as much as possible, and the antenna and the semiconductor integrated circuit can be electrically connected, which results in further enhanced reliability of the semiconductor device.

A semiconductor device of the invention can have long communication distance and high reliability, and be reduced in cost. Therefore, by applying the invention to a radio communication system using the semiconductor device, an application range of the radio communication system can be expanded.

In a manufacturing method of an antenna of the invention, the first substrate and the second substrate are attached to each other so that the first pattern and the second pattern are electrically connected through the anisotropic conductive material and the whole region of the first pattern overlaps with the second pattern. Therefore, the formed antenna materially has a film thickness that is a total of the first pattern and the second pattern. Thus, the antenna can be increased in film thickness and reduced in resistance materially. Further, if the first pattern is partially disconnected, the disconnected portion can be electrically connected by the second pattern, hence probability of the antenna being entirely disconnected can be reduced. Accordingly, the yield of the antenna can be improved.

The second pattern may be formed over the insulating surface of the second substrate (the second insulating surface) so as to be axisymmetric with the first pattern that is seen from a direction perpendicular to the insulating surface of the first substrate (the first insulating surface). Thus, the antenna can be formed so as to have a configuration where the patterns having the same shape overlap with each other with the anisotropic conductive material interposed therebetween. Therefore, if one of the first pattern and the second pattern is partially disconnected, the disconnected portion can be electrically connected by the other pattern, hence probability of the antenna being entirely disconnected can be reduced. Accordingly, the yield of the antenna can be improved.

Further, the anisotropic conductive material may be formed so as to cover all over the first pattern and the insulating surface of the first substrate. Thus, the antenna can be provided in a region surrounded by the first substrate, the second substrate, and the anisotropic conductive material. Thus, not exposed outside, the antenna can be protected from an impact from outside. In addition, the antenna can be prevented from corroding or the like due to exposure to ambient air. Accordingly, the antenna can be reduced in deterioration and increased in reliability.

In particular, in the case of an antenna formed by a droplet discharging method or a printing method, it is difficult to reduce resistance while increasing a film thickness and to improve yield. In a manufacturing method of an antenna of the invention, the first pattern and the second pattern are used in combination as the antenna even when the first pattern and the second pattern are formed by a droplet discharging method or a printing method. Accordingly, the antenna can have lower resistance and higher yield.

By the manufacturing method of an antenna of the invention, an antenna having low resistance and high yield, and high reliability can be manufactured. Therefore, the invention is applied to a manufacturing method of a semiconductor device which is formed so that a semiconductor integrated circuit is electrically connected to the antenna, and inputs/outputs data by radio communication through the antenna, the semiconductor device can have longer communication distance and higher reliability, and be reduced in cost.

The semiconductor integrated circuit can be provided so as to be electrically connected to the first pattern or the second pattern in the contact hole penetrating through the first substrate to reach the first pattern or the contact hole penetrating through the second substrate to reach the second pattern. Thus, the antenna can be prevented from being exposed to the outside as much as possible, and the antenna and the semiconductor integrated circuit can be electrically connected, which results in further enhanced reliability of the semiconductor device.

BRIEF DESCRIPTION OF DRAWINGS

FIGS. 13A and 13B are diagrams each showing a structure of Embodiment 5.

BEST MODE FOR CARRYING OUT THE INVENTION

Figure 1A:
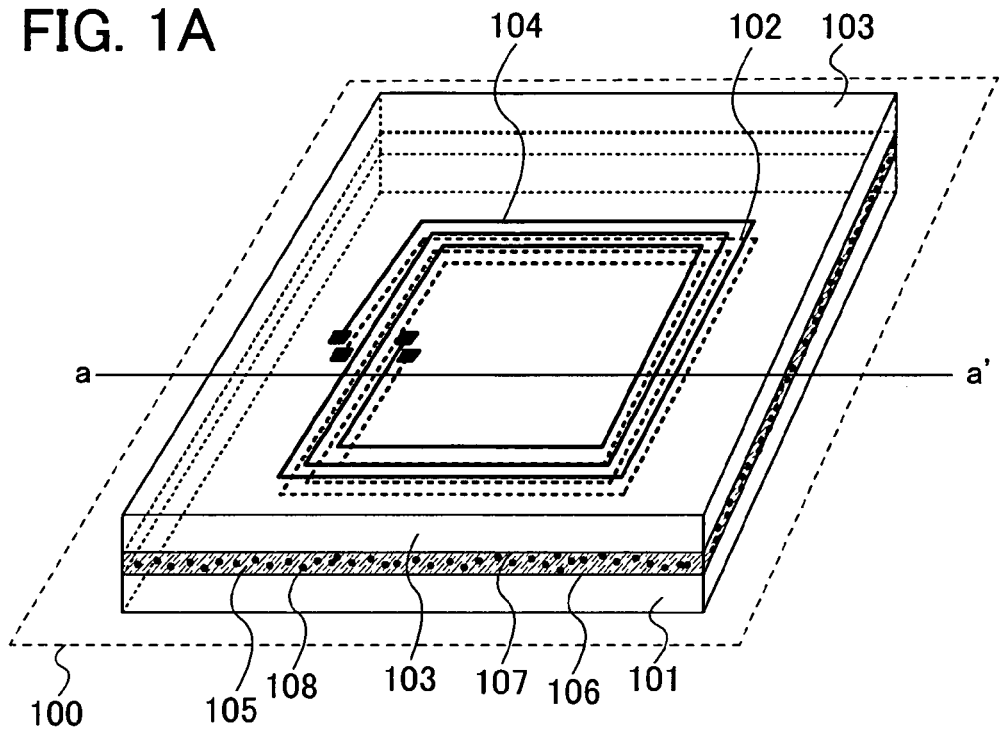
FIGS. 1A to 1C are views each showing a structure of Embodiment Mode 1.

Although the invention will be fully described by way of embodiment modes and embodiments with reference to the accompanying drawings, it is to be understood that various changes and modifications will be apparent to those skilled in the art. Therefore, unless such changes and modifications depart from the spirit and the scope of the invention, they should be construed as being included therein. Note that common portions are denoted by the same reference numerals in all diagrams in a structure of the invention described below. In the invention, "being connected" means "being electrically connected". Therefore, another element or the like may be additionally arranged between the predetermined elements.

EMBODIMENT MODE 1

Figure 1B:
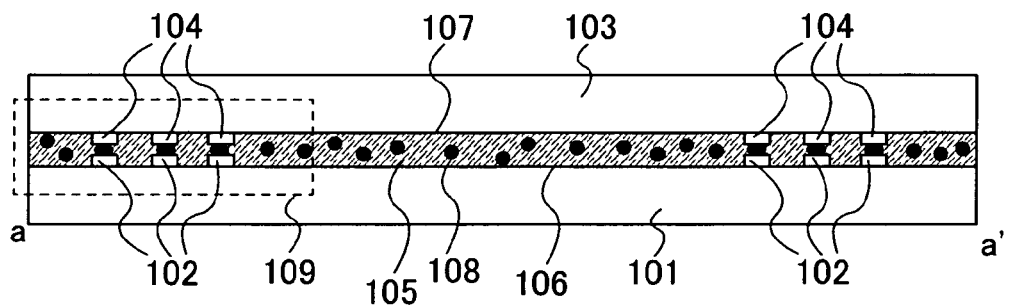
Figure 1C:
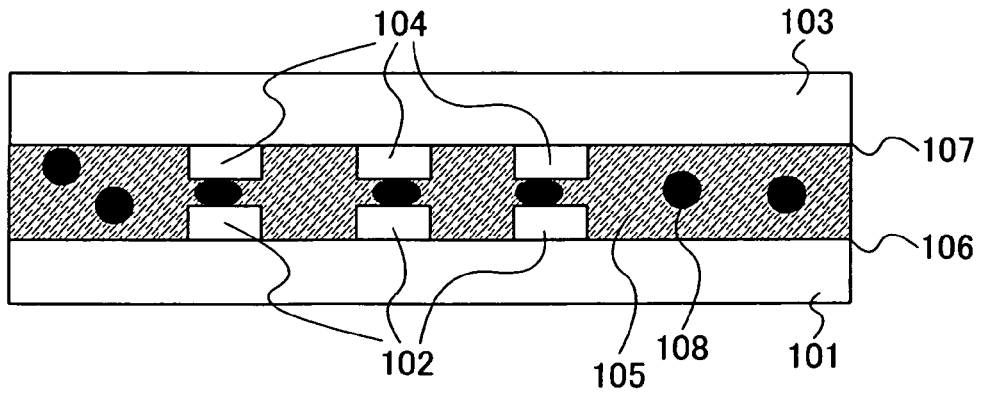

A structure of an antenna of the invention is described. FIGS. 1A to 1C each show a structure of the antenna. FIG. 1A shows a perspective view of an antenna. FIG. 1B shows a cross-sectional view taken along line A-A' in FIG. 1A. FIG. 1C shows an enlarged view of a region 109 in FIG. 1B. Note that common portions are denoted by the same reference numerals in FIGS. 1A to 1C. An antenna 100 includes a first substrate 101, a first pattern 102, a second substrate 103, a second pattern 104, and an anisotropic conductive material 105. The first substrate 101 has a first insulating surface 106. The first pattern 102 is formed of a conductive material, over the first insulating surface 106. The second substrate 103 is provided so as to face the surface of the first substrate 101, over which the first pattern 102 is formed, and has a second insulating surface 107. The second pattern 104 is formed of a conductive material, over the second insulating surface 107. The anisotropic conductive material 105 electrically connects the first pattern 102 and the second pattern 104. The whole region of the first pattern 102 overlaps with the second pattern 104 with the anisotropic conductive material 105 interposed therebetween. In addition, seen from a direction perpendicular to the first insulating surface 106 and the second insulating surface 107, the whole region of the second pattern overlaps with the first pattern with the anisotropic conductive material interposed therebetween. Further, the anisotropic conductive material 105 may be arranged so as to cover all over the first insulating surface 106 and the second insulating surface 107.

A conductive material constituting the first pattern 102 and that constituting the second pattern 104 may be the same or different. As a conductive material for the first pattern 102 and the second pattern 104, a material containing at least one of Ag, Au, Al, Cu, Zn, Sn, Ni, Cr, Fe, Co, and Ti can be used.

The first substrate 101 and the second substrate 103 may have flexibility, may be made of plastic, and may be formed of the same materials or different materials. Further, the first substrate 101 and the second substrate 103 may be formed of polyethylene terephthalate, polyether sulfone, polyethylene naphthalate, polycarbonate, nylon, polyetheretherketone, polysulfone, polyether imide, polyarylate, polybutylene terephthalate, or polyimide.

The anisotropic conductive material 105 has conductivity with respect to a direction perpendicular to the first insulating surface 106 and the second insulating surface 107, and has an insulation property with respect to a direction parallel to those. An anisotropic conductive paste (ACP) cured by heat or an anisotropic conductive film (ACF) cured by heat can be used for the anisotropic conductive material 105. An anisotropic conductive paste has a structure where particles having conductive surfaces (hereinafter referred to as conductive particles) are dispersed in a layer containing an adhesive as its main component, which is referred to as a binder layer. An anisotropic conductive film has a structure where particles having conductive surfaces (hereinafter referred to as conductive particles) are dispersed in a thermosetting or thermoplastic resin film. In FIGS. 1A to 1C, conductive particles 108 included in the anisotropic conductive material 105 are shown. An anisotropic conductive paste or an anisotropic conductive film is thus used, whereby the first pattern 102 and the second pattern 104 can be surely connected electrically as well as can be attached to each other.

In a case where an anisotropic conductive paste or an anisotropic conductive film is used as the anisotropic conductive material 105, a particle size of the conductive particle 108 in the anisotropic conductive material 105, and a shape of the first pattern 102 and the second pattern 104 can be set so as to satisfy a predetermined relation. For example, a case where the first pattern 102 and the second pattern 104 have a coil shape is considered. A particle size of the conductive particle 108 and spacing of wiring of the first pattern 102 are required to be set so that the first pattern 102 is not short-circuited. In addition, a particle size of the conductive particle 108 and spacing of wiring of the second pattern 104 are required to be set so that the second pattern 104 is not short-circuited. At the least, the particle size of the conductive particle 108 and spacing of wiring of each pattern are required to be set so that the particle size of the conductive particle 108 is smaller than spacing of the first pattern 102 and that of the second pattern 104.

FIGS. 1A to 1C show an example where the first insulating surface 106 and the second insulating surface 107 have the same shape; however, their shape is not limited to this. The first insulating surface 106 may be larger or smaller than the second insulating surface 107. An example is shown where the anisotropic conductive material 105 may be arranged so as to cover all over the first insulating surface 106 and the second insulating surface 107; however, disposition of the anisotropic conductive material 105 is not limited to this. The anisotropic conductive material 105 may be arranged so as to cover all over the first insulating surface 106 or the second insulating surface 107.

Further, FIGS. 1A to 1C show an example where each of the first pattern 102 and the second pattern 104 is a square-shaped coil with three coils; however, a shape of the first pattern 102 and the second pattern 104 is not limited to this. The first pattern 102 and the second pattern 104 can have various shapes. For example, each of them may be a coil with one coil, or a coil with the arbitrary number of coils. Further, each of them may be a triangular coil, a circular coil, or a polygonal coil. In addition, FIG. 1A shows an example where each of the first pattern 102 with a coiled shape and the second pattern 104 with a coiled shape have angles each of which is approximately 90°; however, the shape of the first pattern 102 and the second pattern 104 is not limited to this. For example, each of them may be a triangular coil, a square-shaped coil, or a polygonal coil, which has rounded angles or chamfered angles. Further, each of them is not limited to have a coiled shape, and may have a linear shape. For example, they may be set to have a pair of liner patterns, whereby the antenna 100 may be a dipole antenna.

Figure 14A:
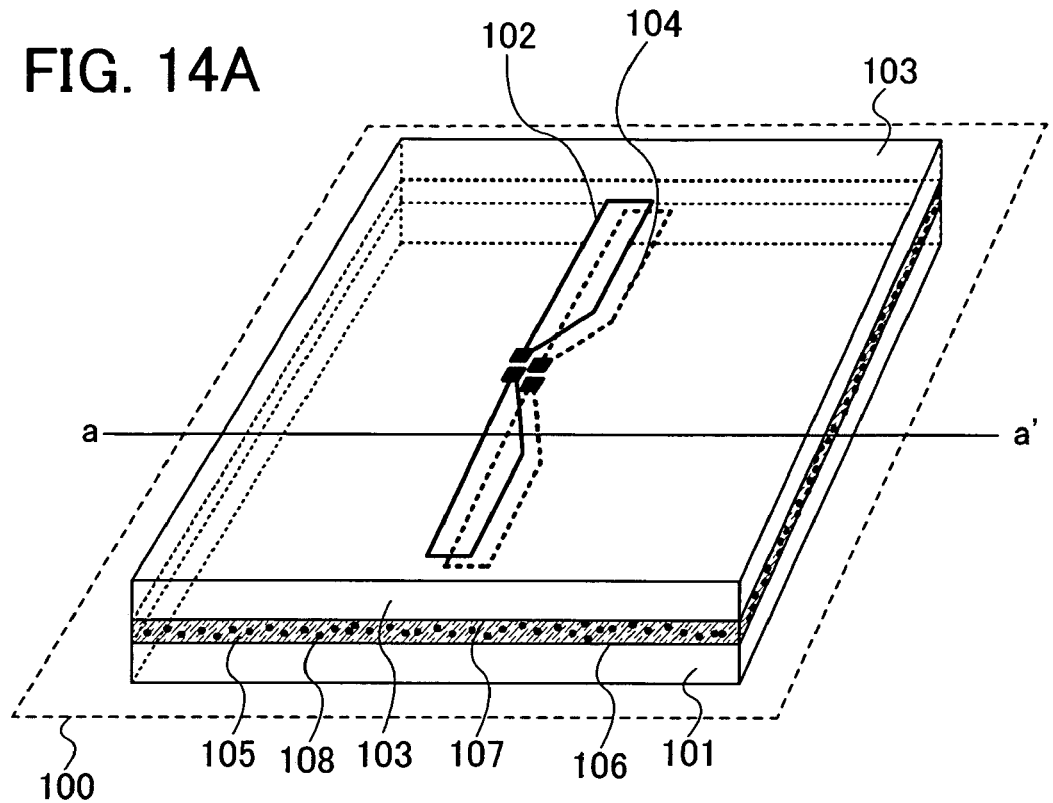
FIGS. 14A and 14B are views each showing a structure of Embodiment Mode 1.
Figure 14B:
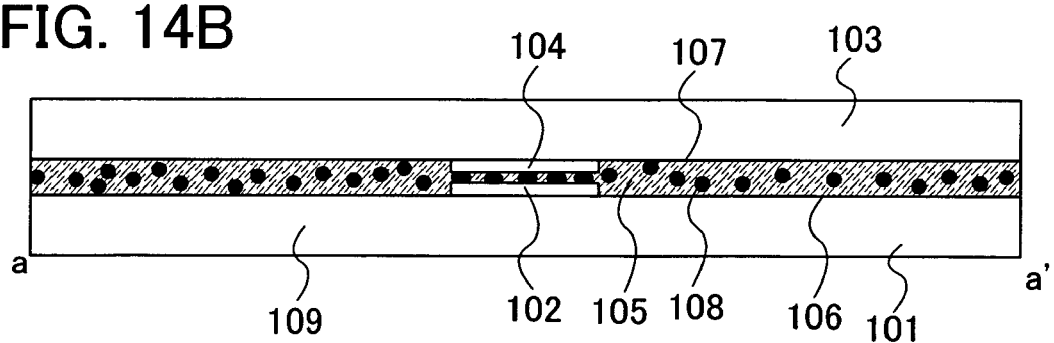

FIGS. 14A and 14B show an example where the antenna 100 is a dipole antenna. Note that common portions to those in FIGS. 1A to 1C are denoted by the same reference numerals, and description thereof is omitted.

In the case of the antenna 100 of the invention, the whole region of the first pattern 102 overlaps with the second pattern 104 with the anisotropic conductive material 105 interposed therebetween. Therefore, the antenna 100 materially has a film thickness that is a total of the first pattern 102 and the second pattern 104. Thus, the antenna 100 can be increased in film thickness and reduced in resistance materially.

Alternatively, an antenna of the invention may have a structure where the whole region of the first pattern 102 overlaps with the second pattern 104 with the anisotropic conductive material 105 interposed therebetween and the whole region of the second pattern 104 overlaps with the first pattern 102 with the anisotropic conductive material interposed therebetween. That is to say, the first pattern 102 and the second pattern 104 have the same shape and overlap with each other with the anisotropic conductive material 105 interposed therebetween. Therefore, even if one of the first pattern 102 and the second pattern 104 is partially disconnected, the disconnected portion can be electrically connected by the other pattern, hence probability of the antenna 100 being entirely disconnected can be reduced. Accordingly, the yield of the antenna 100 can be improved.

The anisotropic conductive material 105 may be formed so as to cover all over the first pattern 102 and the first insulating surface 106 of the first substrate 101. Thus, the antenna 100 can be provided in a region surrounded by the first substrate 101, the second substrate 103, and the anisotropic conductive material 105. Thus, not exposed outside, the antenna 100 can be protected from an impact from outside. In addition, the antenna 100 can be prevented from corroding or the like due to exposure to ambient air. Accordingly, the antenna 100 can be reduced in deterioration and increased in reliability.

As described above, an antenna having low resistance, high yield, and high reliability can be obtained.

EMBODIMENT MODE 2

Figure 2A:
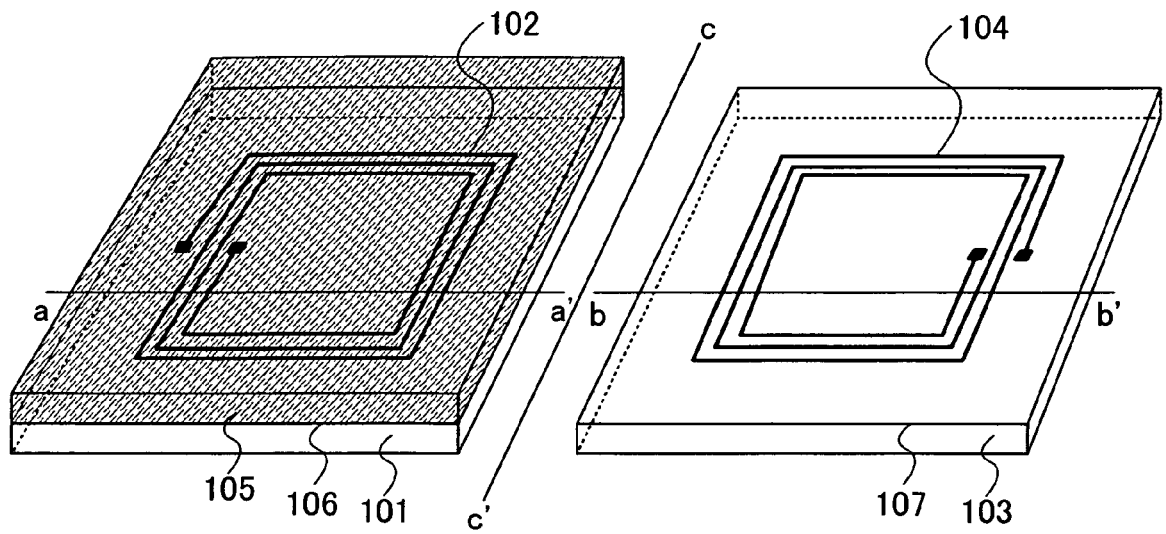
FIGS. 2A to 2D are views each showing a structure of Embodiment Mode 2.
Figure 2B:
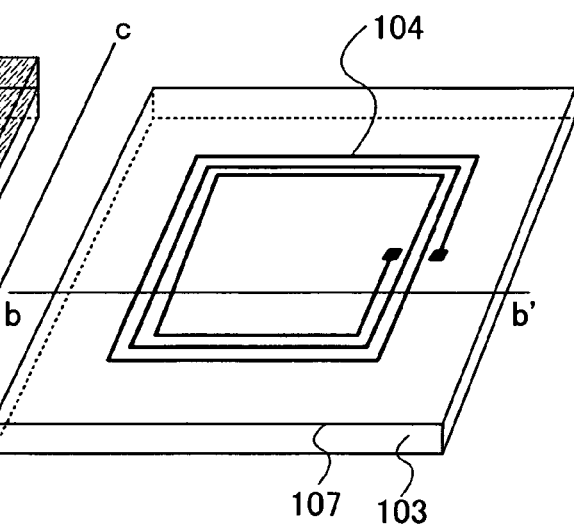
Figure 2C:
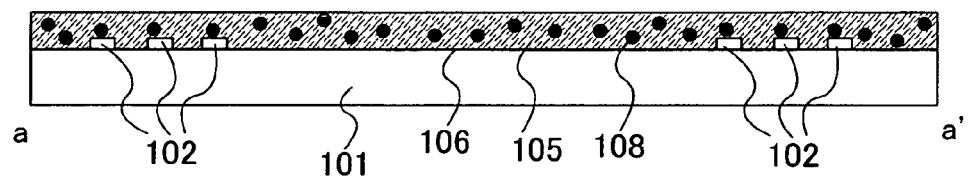

Description is made of a manufacturing method of an antenna of the invention with reference to FIGS. 2A to 2C. Note that common portions to those in FIGS. 1A to 1C are denoted by the same reference numerals, and description thereof is omitted.

As shown in FIG. 2A, the first pattern 102 is formed of a conductive material, over the first insulating surface 106 of the first substrate 101. The first pattern 102 can be formed by a droplet discharging method or a printing method. Note that a conductive film may be etched using photolithography or the like to form the first pattern 102. Subsequently, the anisotropic conductive material 105 is formed so as to cover all over the first pattern 102. In FIG. 2A, the conductive particles 108 in the anisotropic conductive material 105 are not shown. FIG. 2A shows an example where the anisotropic conductive material 105 is formed so as to cover all over the first insulating surface 106. Note that FIG. 2C shows a cross-sectional view taken along line A-A' in FIG. 2A.

Figure 2D:
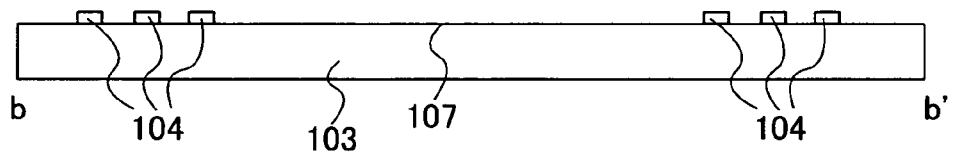

As shown in FIG. 2B, the second pattern 104 is formed of a conductive material, over the second insulating surface 107 of the second substrate 103. Note that FIG. 2D shows a cross-sectional view taken along line B-B' in FIG. 2B. The second pattern 104 may be formed over the second insulating surface 107 of the second substrate 103 so as to be axisymmetric with the first pattern 102 that is seen from a direction perpendicular to the first insulating surface 106 of the first substrate 101. In other words, a line C-C' is a straight line extended toward a direction parallel to the first insulating surface 106, and the first pattern 102 and the second pattern 104 have symmetric shapes with respect to a line C-C'. The second pattern 104 can be formed by a droplet discharging method or a printing method. Note that a conductive film may be etched using photolithography or the like to form the second pattern 104.

After that, the first substrate 101 and the second substrate 103 are overlapped with each other so that the first insulating surface 106 and the second insulating surface 107 face each other and the whole region of the first pattern 102 overlaps with the second pattern 104. The first pattern 102 and the second pattern 104 are electrically connected through the anisotropic conductive material 105 by thermocompression bonding, and at the same time, the first substrate 101 and the second substrate 103 are attached to each other. Thus, the antenna 100 shown in FIG. 1A can be manufactured.

In a manufacturing method of an antenna of the invention, the whole region of the first pattern 102 overlaps with the second pattern 104 with the anisotropic conductive material 105 interposed therebetween. Therefore, the antenna 100 materially has a film thickness that is a total of the first pattern 102 and the second pattern 104. Thus, the antenna 100 can be increased in film thickness and reduced in resistance materially.

The second pattern 104 is formed over the second insulating surface 107 so as to be axisymmetric with the first pattern 102 that is seen from a direction perpendicular to the first insulating surface 106. Thus, the antenna 100 can be obtained, which has a structure where the patterns having the same shape overlap with each other with the anisotropic conductive material interposed therebetween. Therefore, even if one of the first pattern 102 and the second pattern 104 is partially disconnected, the disconnected portion can be electrically connected by the other pattern, hence probability of the antenna 100 being entirely disconnected can be reduced. Accordingly, the yield of the antenna 100 can be improved.

Further, the anisotropic conductive material 105 may be formed so as to cover all over the first pattern 102 and the first insulating surface 106. Thus, the antenna 100 can be provided in a region surrounded by the first substrate 101, the second substrate 103, and the anisotropic conductive material 105. Thus, not exposed outside, the antenna 100 can be protected from an impact from outside. In addition, the antenna 100 can be prevented from corroding or the like due to exposure to ambient air. Accordingly, the antenna 100 can be reduced in deterioration and increased in reliability.

In particular, in the case of an antenna formed by a droplet discharging method or a printing method, it is difficult to reduce resistance while increasing a film thickness and to improve yield. In a manufacturing method of an antenna of the invention, the first pattern 102 and the second pattern 104 are used in combination as the antenna 100 even in the case where the first pattern 102 and the second pattern 104 are formed by a droplet discharging method or a printing method. Accordingly, the antenna 100 can have lower resistance and enhanced yield.

As described above, an antenna having low resistance, high yield, and high reliability can be obtained.

This embodiment mode can be implemented in free combination with Embodiment Mode 1.

EMBODIMENT MODE 3

Figure 3A:
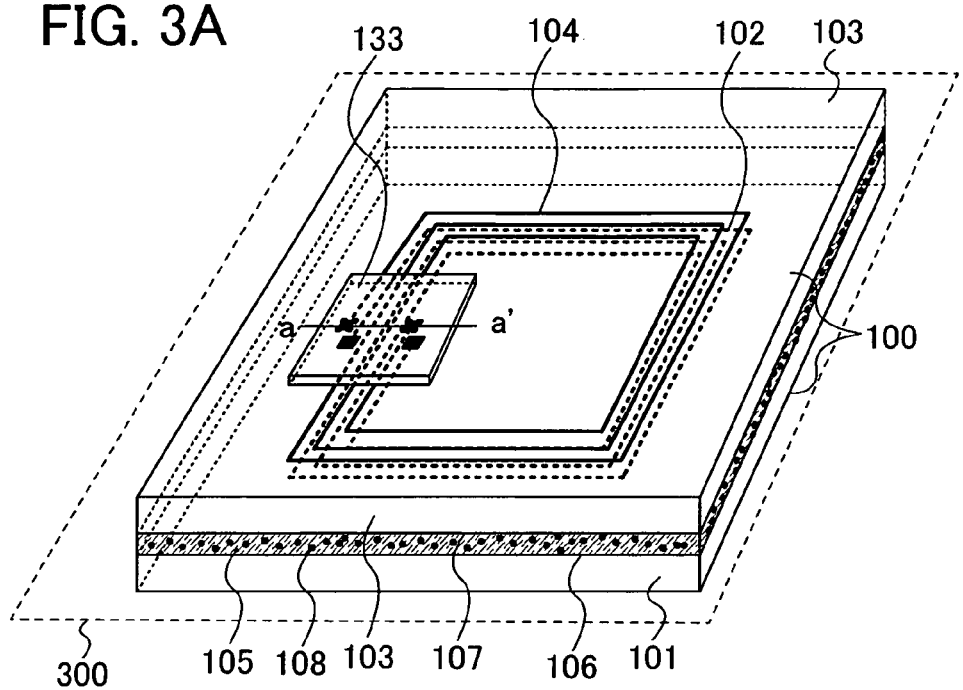
FIGS. 3A to 3C are views each showing a structure of Embodiment Mode 3.
Figure 3B:
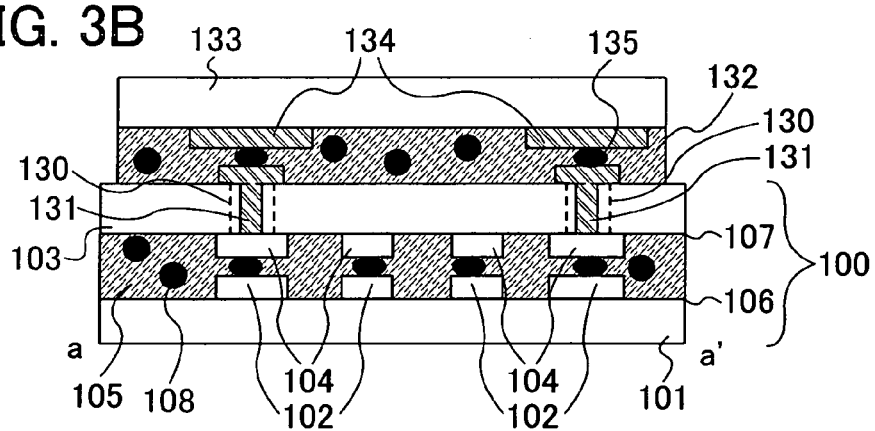
Figure 3C:
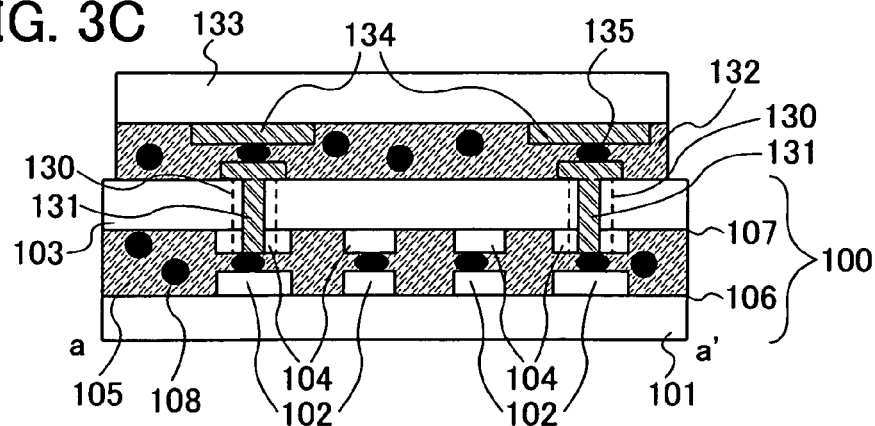

Description is made of a structure of a semiconductor device of the invention with reference to FIGS. 3A to 3C. Note that common portions to those in FIGS. 1A to 2D are denoted by the same reference numerals, and description thereof is omitted.

FIG. 3A shows a perspective view of a semiconductor device. FIGS. 3B and 3C each show a cross-sectional view taken along line A-A' in FIG. 3A. Note that common portions to those in FIGS. 1A to 1C are denoted by the same reference numerals. A semiconductor device 300 includes the antenna 100 and a semiconductor integrated circuit 133 electrically connected to the antenna 100. The semiconductor device 300 transmits/receives a radio signal by the antenna 100, and inputs/outputs data.

As shown in FIG. 3B, a pair of contact holes 130 penetrating through the second substrate 103 to reach the second pattern 104 are provided. In a structure in FIG. 3B, the contact holes 130 do not penetrate through the second pattern 104. An electrode 131 is provided so as to be connected to the second pattern 104 through the contact hole 130. A pair of electrodes 134 and 131 of the semiconductor integrated circuit 133 are electrically connected to each other by an anisotropic conductive material 132 provided over the electrode 131. FIG. 3A to 3C show conductive particles 135 included in the anisotropic conductive material 132. Thus, one and the other of the pair of electrodes 134 of the semiconductor integrated circuit 133 are electrically connected to one end and the other end of the antenna 100, respectively. Note that the pair of electrodes 134 and the pair of electrodes 131 of the semiconductor integrated circuit 133 are electrically connected to each other by a conductive adhesive agent such as a silver paste, a copper paste, or a carbon paste, or solder.

It is to be noted that the pair of contact holes 130 may penetrate through the second substrate 103, and then penetrate the second pattern 104, as shown in FIG. 3C. Alternatively, the pair of contact holes 130 may be formed so as to penetrate through the second substrate 103, and partially remove the second pattern 104.

When the contact holes 130 are formed so as to reach the second pattern 104 (when the contact holes 130 does not penetrate through the second pattern 104), as shown in FIG. 3B, there is the second pattern 104 even in a portion where the contact holes 130 are formed. Therefore, the first pattern 102 and the second pattern 104 can be more surely connected electrically in the portion where the contact holes 130 are formed. On the other hand, when the contact holes 130 are formed so as to penetrate through the second pattern 104, adhesiveness between the second pattern 104 and the electrode 131 can be improved. As a result, the electrode 131 and the second pattern 104 can be more surely connected to each other electrically. Note that FIGS. 3A to 3C each show a structure where the contact holes 130 are formed in the second substrate 103; however, the invention is not limited to this. The contact holes 130 may penetrate through the first substrate 101 to reach the first pattern 102.

The semiconductor device 300 of the invention can have longer communication distance, and higher reliability, and be reduced in cost since the antenna 100 having low resistance and high yield, and high reliability is employed. Further, the semiconductor integrated circuit 133 is electrically connected to the antenna 100 by the electrodes 131 formed in the contact hole 130 penetrating through the first substrate 101 to reach the first pattern 102; or the contact hole 130 penetrating through the second substrate 103 to reach the second pattern 104. Thus, the antenna 100 can be electrically connected to the semiconductor integrated circuit 133 while being prevented from being exposed to the outside as much as possible. Accordingly, reliability of the semiconductor device 300 can be further improved.

As described above, an inexpensive semiconductor device having longer communication distance and higher reliability can be obtained.

This embodiment mode can be implemented in free combination with any of Embodiment Modes 1 and 2.

EMBODIMENT MODE 4

Description is made of a manufacturing method of a semiconductor device of the invention with reference to FIGS. 4A to 5E. Note that common portions to those in FIGS. 1A to 3C are denoted by the same reference numerals, and description thereof is omitted.

Figure 4A:
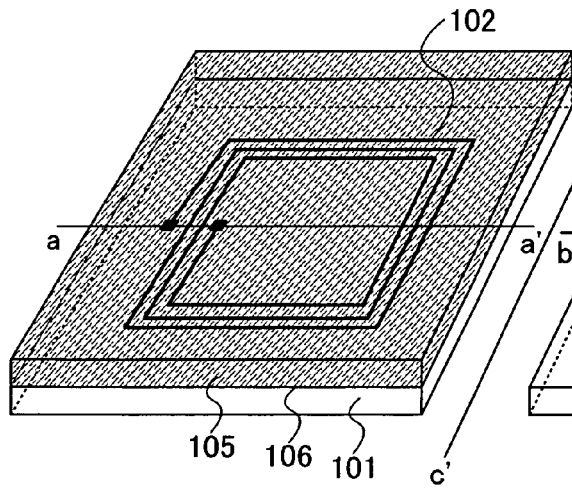
FIGS. 4A to 4F are views each showing a structure of Embodiment Mode 4.

As shown in FIG. 4A, the first pattern 102 is formed of a conductive material, over the first insulating surface 106 of the first substrate 101. Further, the anisotropic conductive material 105 is formed so as to cover all over the first pattern 102. In FIG. 4A, the conductive particles 108 in the anisotropic conductive material 105 are not shown. Note that FIG. 4C shows a cross-sectional view taken along line A-A' in FIG. 4A.

Figure 4B:
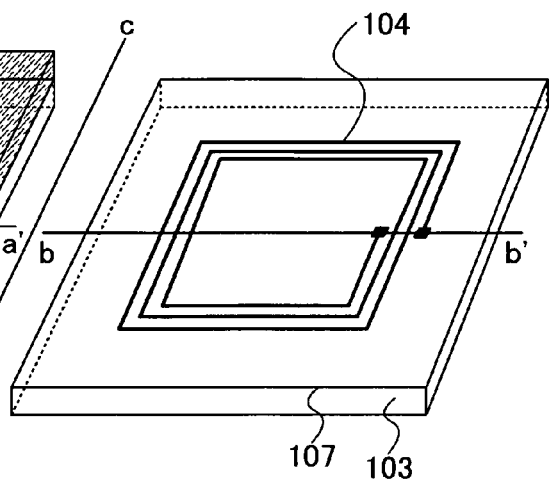
Figure 4C:
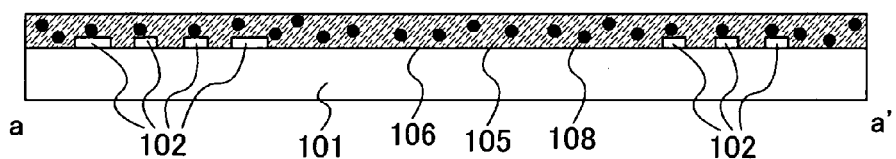
Figure 4D:
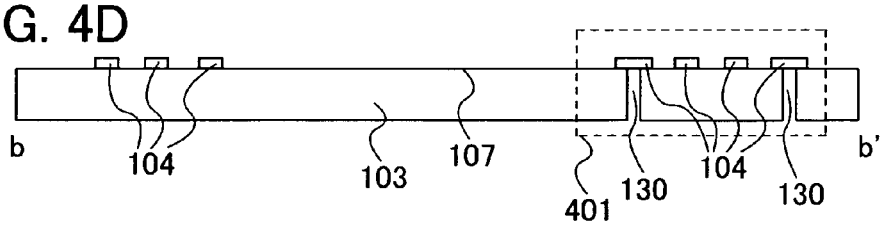
Figure 4E:
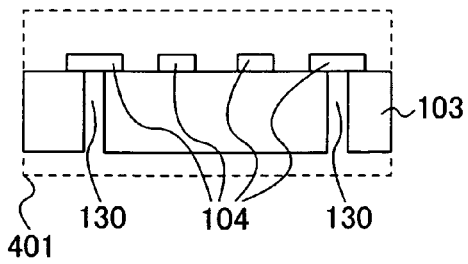
Figure 4F:
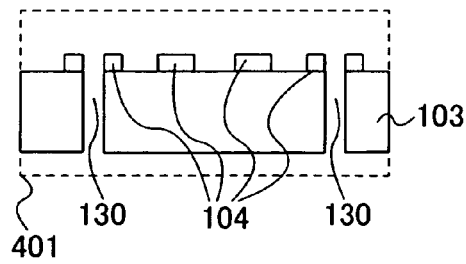

As shown in FIG. 4B, the second pattern 104 is formed of a conductive material, over the second insulating surface 107 of the second substrate 103. Note that FIG. 4D shows a cross-sectional view taken along line B-B' in FIG. 4B. The second pattern 104 may be formed over the second insulating surface 107 of the second substrate 103 so as to be axisymmetric with the first pattern 102 that is seen from a direction perpendicular to the first insulating surface 106 of the first substrate 101. In other words, the first pattern 102 and the second pattern 104 are symmetrical with respect to a line C-C' in FIGS. 4A and 4B. As shown in FIG. 4D, the pair of contact holes 130 penetrating through the second substrate 103 to reach the second pattern 104 is formed. FIG. 4E shows an enlarged view of a peripheral portion 401 around the contact hole 130. In FIG. 4E, the contact holes 130 is formed so as to penetrate through the second substrate 103 to reach the second pattern 104. Alternatively, the contact holes 130 may be formed so as to penetrate through the second substrate 103, and then penetrate through the second pattern 104, as shown in FIG. 4F. Further alternatively, the contact holes 130 may be formed so as to penetrate through the second substrate 103, and partially remove the second pattern 104. The contact holes 130 may be formed mechanically with a cutter, a knife, or the like, or formed by using a laser. A cutter, a knife, or the like can be used when the contact holes 130 are formed so as to penetrate through the second substrate 103, and then penetrate through the second pattern 104. Meanwhile, a laser can be used when the contact holes 130 are formed so as to penetrate through the second substrate 103 to reach the second pattern 104, or the contact holes 130 are formed so as to penetrate through the second substrate 103 and partially remove the second pattern 104.

Figure 5A:
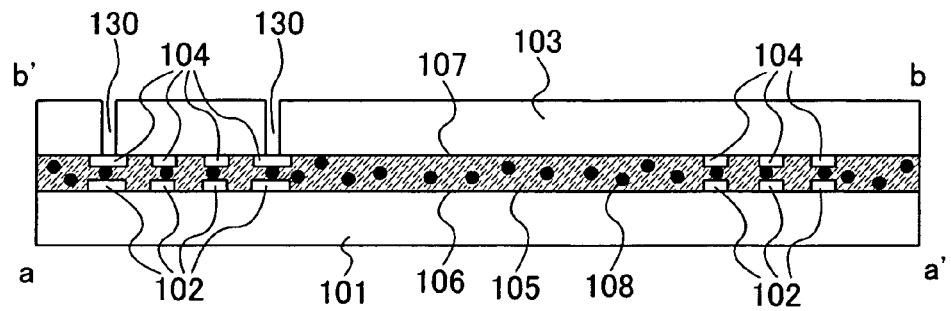
FIGS. 5A to 5E are views each showing a structure of Embodiment Mode 4.
Figure 5B:
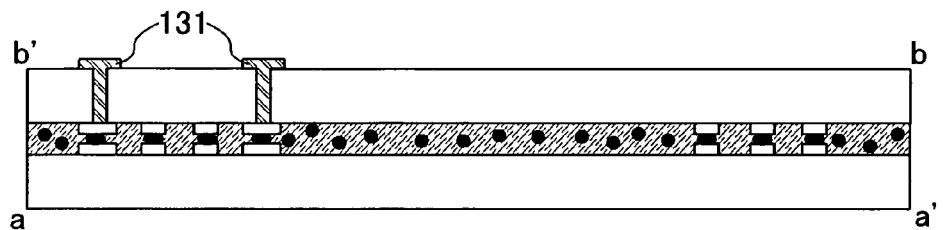

As shown in FIG. 5A, the first substrate 101 and the second substrate 103 are overlapped with each other so that the first insulating surface 106 and the second insulating surface 107 face each other and the whole region of the first pattern 102 overlaps with the second pattern 104.

Subsequently, the first pattern 102 and the second pattern 104 are electrically connected to each other through the anisotropic conductive material 105 by thermocompression bonding, and at the same time, the first substrate 101 and the second substrate 103 are attached to each other. Then, the pair of electrodes 131 are provided so as to be connected to the second pattern 104 in the contact holes 130.

Figure 5C:
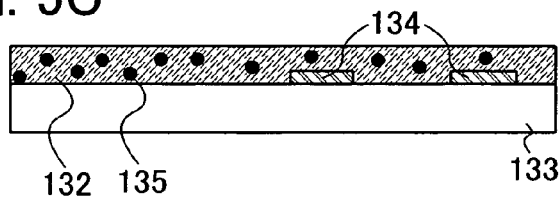

Subsequently, the anisotropic conductive material 132 is provided over the pair of electrodes 134 included in the semiconductor integrated circuit 133, as shown in FIG. 5C. Note that the anisotropic conductive material 132 may be provided over the electrodes 131.

Figure 5D:
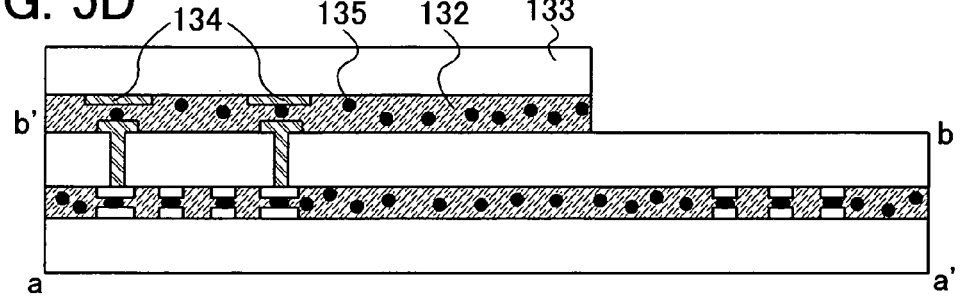

Subsequently, the pair of electrodes 134 and the pair of electrodes 131 are arranged so as to overlap with each other with the anisotropic conductive material 132 interposed therebetween, as shown in FIG. 5D.

Figure 5E:
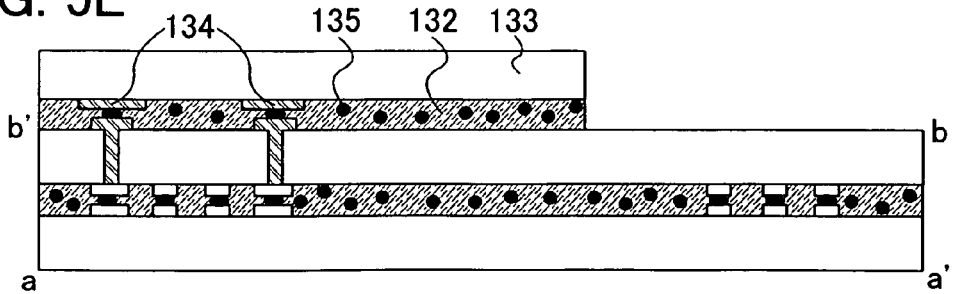

Subsequently, the pair of electrodes 134 and the pair of electrodes 131 of the semiconductor integrated circuit 133 are electrically connected to each other by thermocompression bonding as shown in FIG. 5E. Thus, one and the other of the pair of electrodes 134 of the semiconductor integrated circuit 133 are electrically connected to one end and the other end of the antenna 100, respectively. Note that the pair of electrodes 134 and the pair of electrodes 131 of the semiconductor integrated circuit 133 are electrically connected to each other by using a conductive adhesive agent such as a silver paste, a copper paste, or a carbon paste, or solder. Accordingly, the semiconductor device 300 of the invention is completed.

By a manufacturing method of a semiconductor device of the invention, the antenna 100 having low resistance, high yield, and high reliability can be obtained; therefore, a semiconductor device can have longer communication distance and higher reliability, and be reduced in cost. Further, the semiconductor integrated circuit 133 is electrically connected to the antenna 100 by the electrodes 131 formed in the contact hole 130 penetrating through the second substrate 103 to reach the second pattern 104. Thus, the antenna 100 can be electrically connected to the semiconductor integrated circuit 133 while being prevented as much as possible from being exposed to the outside. Accordingly, reliability of the semiconductor device 300 can be further improved.

As described above, an inexpensive semiconductor device having longer communication distance and high reliability can be obtained.

This embodiment mode can be implemented in free combination with any of Embodiment Modes 1 to 3.

EMBODIMENT 1

Description is made of an example where an antenna of the invention is actually manufactured with reference to FIGS. 6A to 6D. Note that common portions to those in FIGS. 1A to 5E are denoted by the same reference numerals, and description thereof is omitted.

Figure 6A:
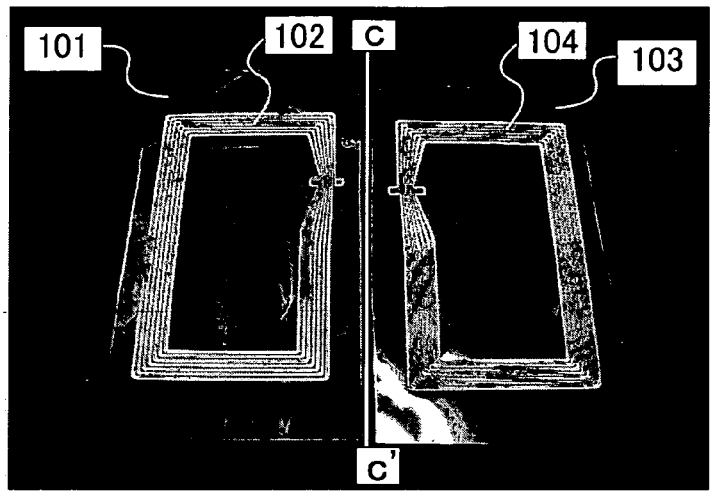
FIGS. 6A to 6D are views each showing a structure of Embodiment 1.

As shown in FIG. 6A, the first pattern 102 is formed of a conductive material, over the first insulating surface 106 of the first substrate 101. Further, the second pattern 104 is formed of a conductive material, over the second insulating surface 107 of the second substrate 103. The second pattern 104 is formed over the second insulating surface 107 of the second substrate 103 so as to be axisymmetric with the first pattern 102 that is seen from a direction perpendicular to the first insulating surface 106 of the first substrate 101. In other words, the first pattern 102 and the second pattern 104 are symmetrical with respect to a line C-C' in FIG. 6A.

A film containing polyethylene naphthalate with a thickness of 50 μm is used for the first substrate 101 and the second substrate 103. The first pattern 102 and the second pattern 104 are formed by screen printing. Each of the first pattern 102 and the second pattern 104 is a square-shaped coil of approximately 76 mm (outer circumference)×approximately 45 mm (outer circumference) (approximately 61 mm (inner circumference)×approximately 29 mm (inner circumference)). Wiring has a width of approximately 800 μm, and spacing of approximately 300 μm (spacing of a portion other than a periphery of a contact hole for electrically connecting a semiconductor integrated circuit to an antenna), and 7 coils. By a screen printing method, a paste including metal particles is arranged over a desired surface using a plate having an opening of a desired pattern as a mask, which is heated and baked to form the desired pattern. In this embodiment, the first pattern 102 is formed by a screen printing method using a paste including metal particles of Ag. In this case, AGEP201X manufactured by Sumitomo Electric Industries, Ltd. is used. Heating and baking are performed at 160° C. for 30 minutes.

Figure 6B:
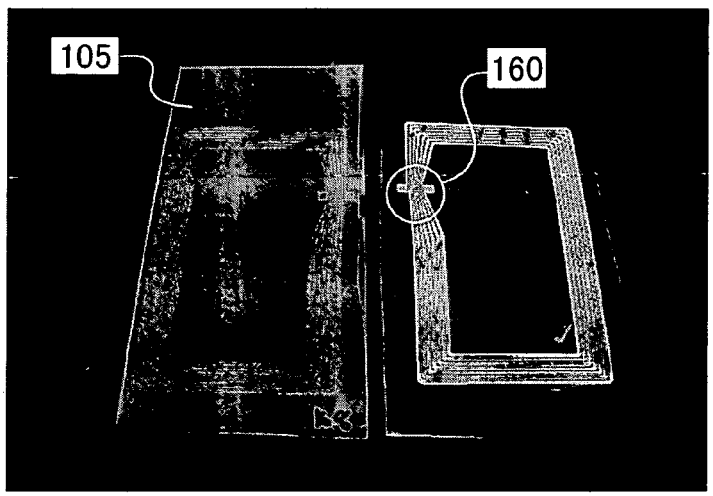

Subsequently, an anisotropic conductive paste is formed as the anisotropic conductive material 105 so as to cover all over the first pattern 102 and the first insulating surface 106, as shown in FIG. 6B. As an anisotropic conductive paste, 3373C manufactured by Three Bond Co., Ltd. is used.

Figure 6C:
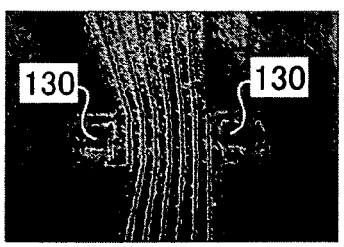

Note that in this embodiment, the contact holes 130 for electrically connecting a semiconductor integrated circuit to an antenna is formed before the first substrate 101 and the second substrate 103 are overlapped with each other. FIG. 6C shows an enlarged view of a peripheral portion 160 around the contact hole 130. The contact holes 130 for electrically connecting a semiconductor integrated circuit to an antenna are formed so as to penetrate through the second substrate 103, and then also penetrate through the second pattern 104. The contact holes 130 are mechanically formed by a cutter.

In FIGS. 6A to 6D, spacing of wiring of the first pattern 102 and spacing of wiring of the second pattern 104 each having a coil shape are narrow in the peripheral portion 160 around a contact hole. This is because spacing between a pair of electrodes (corresponding to the electrodes 134 in FIGS. 5C to 5E) of the antenna 100 is made to correspond to spacing between a pair of electrodes (corresponding to the electrodes 131 in FIG. 5B) of a semiconductor integrated circuit. When the pair of electrodes of a semiconductor integrated circuit are electrically connected to the pair of electrodes of the antenna 100 by the anisotropic conductive material 105, positions of the electrodes are thus necessary to correspond respectively. Note that in the peripheral portion 160 around the contact hole, a wiring electrically connected to the pair of electrodes of the semiconductor integrated circuit may be provided, and the wiring may be led, so that the pair of electrodes of the semiconductor integrated circuit are electrically connected to the pair of electrodes of the antenna 100, instead of narrowing spacing of wiring of the first pattern 102 and the second pattern 104 each having a coil shape.

After that, the first substrate 101 and the second substrate 103 are overlapped with each other so that the first insulating surface 106 and the second insulating surface 107 face each other and the whole region of the first pattern 102 overlaps with the second pattern 104. Then, pressure of 160 MPa is applied in a state where an anisotropic conductive paste is at 160° C. for 20 seconds. Thus, the first pattern 102 and the second pattern 104 are electrically connected through the anisotropic conductive material 105, and at the same time, the first substrate 101 and the second substrate 103 are attached to each other.

Figure 6D:
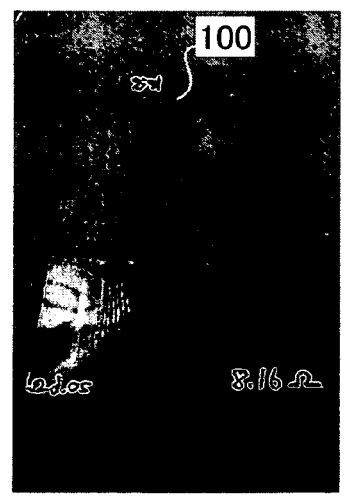

Through aforementioned steps, the antenna 100 shown in FIG. 6D is manufactured.

Resistance of the antenna 100 is measured, which is approximately 8.2Ω. On the other hand, resistance of the first pattern 102 and resistance of the second pattern 104 are measured, which are approximately 21Ω and approximately 17Ω, respectively. Consequently, resistance of the antenna 100 can be made lower.

The antenna 100 has a structure where patterns with the same shape overlap with each other with the anisotropic conductive material 105 interposed therebetween. Therefore, if one of the first pattern 102 and the second pattern 104 is partially disconnected, the disconnected portion can be electrically connected by the other pattern, hence probability of the antenna 100 being entirely disconnected can be reduced, and the yield of the antenna 100 can be enhanced.

The anisotropic conductive material 105 is formed so as to cover all over the first pattern 102 and the first insulating surface 106; therefore, the antenna 100 can be provided in a region surrounded by the first substrate 101, the second substrate 103, and the anisotropic conductive material 105. Thus, not exposed outside, the antenna 100 can be protected from an impact from outside. In addition, the antenna 100 can be prevented from corroding or the like due to exposure to ambient air. Accordingly, the antenna 100 can be reduced in deterioration and increased in reliability.

As described above, an antenna having low resistance, high yield, and high reliability can be obtained.

This embodiment can be implemented in free combination with any of Embodiment Modes 1 to 4.

EMBODIMENT 2

Description is made of an example of a specific configuration of the semiconductor integrated circuit 133 included in a semiconductor device of the invention and a manufacturing method thereof with reference to FIGS. 7A to 9B. Note that common portions to those in FIGS. 1A to 6D are denoted by the same reference numerals.

The semiconductor integrated circuit 133 has an element group 601 including a plurality of thin film transistors. In the drawings, an n-channel transistor and a p-channel transistor are shown as representatives of the element group 601. As the substrate 600, for example, a glass substrate such as a barium borosilicate glass or an alumino-borosilicate glass, a quartz substrate, a ceramic substrate, or the like may be used. A semiconductor substrate having the surface over which an insulating film is formed may be used. A flexible substrate formed of a synthetic resin such as plastic may be used. The surface of the substrate may be planarized by polishing such as CMP (Chemical Mechanical Polishing). A substrate obtained by polishing to thin a glass substrate, a quartz substrate, or a semiconductor substrate may be used. For example, a single crystalline silicon substrate having the surface perpendicular to a vicinity of a crystal axis <100> or <110> of single crystalline silicon, which is polished so as to have a thickness of 0.1 µm or more and 20 µm or less, typically, 1 µm or more and 5 µm or less, can be used.

As the base layer 661 provided over the substrate 600, an insulating film such as silicon oxide, silicon nitride, or silicon nitride oxide may be used. By the base layer 661, diffusion of an alkali metal such as Na and an alkali earth metal included in the substrate 600 into the semiconductor layer 662 and an adverse effect on a property of the thin film transistor can be prevented. A single layer structure is employed for the base layer 661 in FIGS. 7A and 7B; however, it may be formed of two or more layers. Note that in the case where diffusion of impurities is not a big problem, for example, in the case of using a quartz substrate, the base layer 661 is not always required to be provided.

Note that the surface of the substrate 600 may be directly treated by high density plasma. The high density plasma is generated by using a high frequency wave of, for example, 2.45 GHz. Specifically, high density plasma of which electron density is $10^{11}$ to $10^{13}/cm^3$, an electron temperature is 2 eV or less, and an ion energy is 5 eV or less is used. Since such high density plasma having the low electron temperature has a low kinetic energy of active species, a film having few defects can be formed with few plasma damages as compared to conventional plasma treatment. A plasma treatment apparatus for high frequency wave excitation using a radial slot antenna can be used to generate the plasma. A distance between an antenna for generating a high frequency wave and the substrate 600 is set to be 20 to 80 mm (preferably 20 to 60 mm).

The surface of the substrate 600 can be nitrided by performing the high density plasma treatment in a nitrogen atmosphere, for example an atmosphere containing nitrogen (N) and a rare gas (containing at least one of He, Ne, Ar, Kr, and Xe); an atmosphere containing nitrogen, hydrogen (H), and a rare gas; or an atmosphere containing ammonium ($NH_3$) and a rare gas. When the substrate 600 is made of glass, quartz, a silicon wafer, or the like, a nitride layer formed over the surface of the substrate 600, which contains silicon nitride as a main component, can be used as a blocking layer against impurities diffused from the substrate 600 side. A silicon oxide film or a silicon oxynitride film may be formed by a plasma CVD method over the nitride layer to be used as the base layer 661.

When similar high density plasma treatment is performed to the surface of the base layer 661 made of silicon oxide, silicon oxynitride, or the like, the surface and a region with a depth of 1 to 10 nm from the surface can be nitrided. This extremely thin silicon nitride layer is preferable since it functions as a blocking layer and has less stress on the semiconductor layer 662 formed thereover.

The semiconductor layer 662 is formed over the base layer 661. As the semiconductor layer 662, a crystalline semiconductor film or an amorphous semiconductor film, which has an island shape can be used. Alternatively, an organic semiconductor film may be used. A crystalline semiconductor film can be obtained by crystallizing an amorphous semiconductor film. A laser crystallization method, a thermal crystallization method using RTA (Rapid Thermal Anneal) or an annealing furnace, a thermal crystallization method using a metal element which promotes crystallization, or the like can be used as the crystallization method. The semiconductor layer 662 includes a channel forming region 662a and a pair of impurity regions 662b to which an impurity element imparting conductivity is added. It is to be noted that a structure is described, in which low concentration impurity regions 662c to which the impurity element is added at a lower concentration than to the impurity regions 662b are provided between the channel forming region 662a and the pair of impurity regions 662b; however, the invention is not limited to this. The structure may be that of not providing the low concentration impurity regions 662c. In addition, a structure in which a silicide is formed over a part of the upper surface of the pair of impurity regions 662b (in particular, a portion in contact with the wiring 666) or over the whole surface of the upper surface of the pair of impurity regions 662b may be adopted.

Figure 9A:
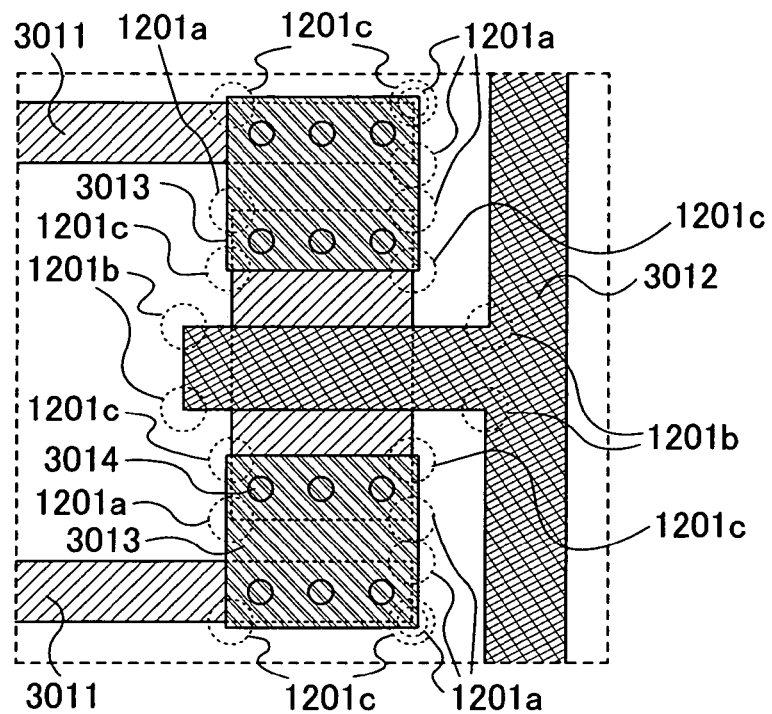
FIGS. 9A and 9B are views each showing a structure of Embodiment 2.
Figure 9B:
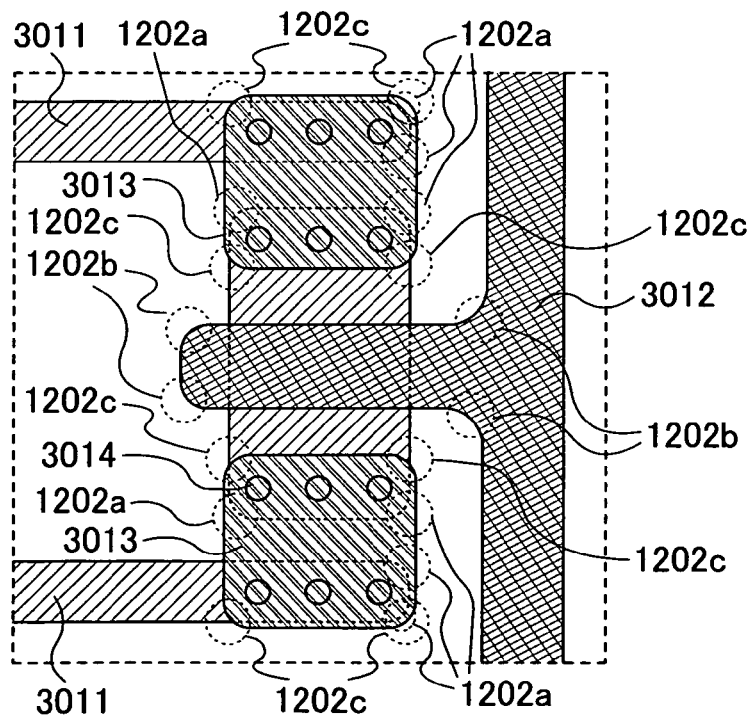

It is to be noted that a wiring formed simultaneously with the semiconductor layer 662 is preferably led so that corners are rounded when seen from a direction perpendicular to a top surface of the substrate 600. FIGS. 9A and 9B are schematic views each showing a method of leading wirings. A wiring formed simultaneously with the semiconductor layer is shown as a wiring 3011. FIG. 9A shows conventional method for leading wirings. FIG. 9B shows a method of the invention for leading wiring. Corners 1202a are rounded as compared to conventional corners 1201a. The rounded corners can prevent dusts and the like from remaining in the corners of the wiring. As a result, defects of a semiconductor device caused by dusts can be reduced and the yield can be improved.

An impurity element imparting conductivity may be added to the channel forming region 662a of the thin film transistor. Thus, a threshold voltage of the thin film transistor can be controlled.

A first insulating layer 663 is formed over the semiconductor layer 662. The first insulating layer 663 can be formed using a single layer or a stack of a plurality of films made of silicon oxide, silicon nitride, silicon nitride oxide, or the like. In this case, the surface of the first insulating layer 663 may be processed by high density plasma in an oxygen atmosphere or a nitrogen atmosphere, thereby being oxidized or nitrided to be densified. The high density plasma is generated using a high frequency wave, for example, 2.45 GHz as described above. It is to be noted that high density plasma with an electron density of $10^{11}$ to $10^{13}/cm^3$, an electron temperature of 2 eV or lower, and an ion energy of 5 eV or lower is used. Plasma can be generated using a plasma processing apparatus utilizing high frequency excitation, which employs a radial slot antenna. In the apparatus for generating high density plasma, the distance between the antenna that generates a high frequency wave and the substrate 600 is 20 to 80 mm (preferably, 20 to 60 mm).

Before the first insulating layer 663 is formed, the high density plasma treatment may be performed to the surface of the semiconductor layer 662 so that the surface of the semiconductor layer is oxidized or nitrided. At this time, the substrate 600 is treated in an oxygen atmosphere or a nitrogen atmosphere at a temperature of 300 to 450° C., whereby a favorable interface with the first insulating layer 663 formed over the semiconductor layer 662 can be obtained.

As the nitrogen atmosphere, an atmosphere containing nitrogen (N) and a rare gas (containing at least one of He, Ne, Ar, Kr, and Xe), an atmosphere containing nitrogen, hydrogen (H), and a rare gas; or an atmosphere containing ammonium ($NH_3$) and a rare gas can be used. As the oxygen atmosphere, an atmosphere containing oxygen (O) and a rare gas;

an atmosphere containing oxygen, hydrogen (H), and a rare gas; or an atmosphere containing dinitrogen monoxide (N$_2$O) and a rare gas can be used.

A gate electrode 664 is formed over the first insulating layer 663. As the gate electrode 664, an element selected from Ta, W, Ti, Mo, Al, Cu, Cr, and Nd; or an alloy containing a plurality of these elements; or a compound of the element can be used. Furthermore, the gate electrode 664 may have a single layer structure or a stacked-layer structure made of these elements, or an alloy or a compound thereof. In the drawings, the gate electrode 664 has a two-layer structure. It is to be noted that the gate electrode 664 and a wiring formed simultaneously with the gate electrode 664 are preferably led so that corners thereof are rounded when seen from the direction perpendicular to the top surface of the substrate 600. The gate electrode 664 and the wiring can be led in the same manner as that shown in FIG. 9B. The gate electrode 664 and a wiring 3012 formed simultaneously with the gate electrode 664 are shown in the drawings. When corners 1202*b* are rounded as compared to corners 1201*b*, dusts and the like can be prevented from remaining at the corners of the wiring. As a result, defects of a semiconductor device caused by dusts can be reduced and the yield can be improved.

A thin film transistor is constituted by the semiconductor layer 662, the gate electrode 664, and the first insulating layer 663 functioning as a gate insulating film between the semiconductor layer 662 and the gate electrode 664. In this embodiment, the thin film transistor has a top gate structure; however, it may be a bottom gate transistor having a gate electrode under the semiconductor layer, or a dual gate transistor having gate electrodes over and under the semiconductor layer.

Insulating films (described as side walls 667*a*, in FIGS. 7A and 7B) are provided so as to be in contact with side surfaces of the gate electrode 664. After the side walls 667*a* are formed, an impurity element imparting conductivity is added to the semiconductor layer 662, so that low concentration impurity regions 662*c* can be formed in a self-aligning manner. Alternatively, a structure in which silicides are formed in a pair of impurity regions 662*b* may be formed in a self-aligning manner, by using the side walls 667*a*. Note that a structure in which the side walls 667*a* are provided is shown; however, the invention is not limited to this and the side walls are not necessarily formed.

A second insulating layer 667 is formed over the gate electrode 664 and the side walls 667*a*. The second insulating layer 667 is desirably an insulating film such as a silicon nitride film, which has a barrier property to block ionic impurities. The second insulating layer 667 is formed of silicon nitride or silicon oxynitride. The second insulating layer 667 functions as a protective film to prevent contamination of the semiconductor layer 662. After the second insulating layer 667 is deposited, hydrogen gas may be introduced and the aforementioned high density plasma treatment may be performed, thereby hydrogenating the second insulating layer 667. Alternatively, the second insulating layer 667 may be nitrided and hydrogenated by introducing ammonium (NH$_3$) gas. Further alternatively, oxidization-nitridation treatment and hydrogenation treatment may be performed by introducing oxygen, dinitrogen monoxide (N$_2$O) gas, and the like together with hydrogen gas. By performing nitridation treatment, oxidization treatment, or oxidization-nitridation treatment in this manner, the surface of the second insulating layer 667 can be densified. Thus, the function of the second insulating layer 667 as a protective film can be enhanced. Hydrogen introduced into the second insulating layer 667 is discharged when thermal treatment is performed at a temperature of 400 to 450° C., thereby hydrogenating the semiconductor layer 662. It is to be noted that the hydrogenation treatment may be performed in combination with hydrogenation treatment using the first insulating layer 663.

A third insulating layer 665 is formed over the second insulating layer 667. The third insulating layer 665 can have a single layer structure or a stacked-layer structure of an inorganic insulating film and an organic insulating film. As the inorganic insulating film, a silicon oxide film formed by a CVD method, a silicon oxide film formed by an SOG (Spin On Glass) method, or the like can be used. As the organic insulating film, a film made of polyimide, polyamide, BCB (benzocyclobutene), acrylic, a positive photosensitive organic resin, a negative photosensitive organic resin, or the like can be used.

For the third insulating layer 665, a material having a skeleton structure formed of a bond of silicon (Si) and oxygen (O) can be used. Substituent of this material may be an organic group containing at least hydrogen (such as an alkyl group or an aromatic hydrocarbon). Alternatively, the substituent may be a fluoro group. Further alternatively, the substituent may be a fluoro group and an organic group containing at least hydrogen.

A wiring 666 is formed over the third insulating layer 665. As the wiring 666, one element selected from Al, Ni, W, Mo, Ti, Pt, Cu, Ta, Au, and Mn, or an alloy containing a plurality of these elements can be used. Alternatively, a single layer structure or a stacked-layer structure made of these elements or the alloy can be used. In the drawings, a single layer structure is shown as an example. It is to be noted that the wiring 666 is preferably led so that corners thereof are rounded when seen from the direction perpendicular to the top surface of the substrate 600. The wiring can be led in a similar manner to that shown in FIG. 9B. A wiring 3013 is shown as the wiring 666. When corners 1202*c* are rounded as compared to corners 1201*c*, dusts and the like can be prevented from remaining at the corners of the wiring. As a result, defects of a semiconductor device caused by dusts can be reduced and the yield can be improved. The wiring 3013 is connected to the wiring 3011 through contact holes 3014. In the structures shown in FIGS. 7A and 7B, the wiring 666 functions as a wiring connected to the source or the drain of the thin film transistor.

A fourth insulating layer 669 is formed over the wiring 666. The fourth insulating layer 669 can have a single layer structure or a stacked-layer structure of an inorganic insulating film and an organic insulating film. As the inorganic insulating film, a silicon oxide film formed by a CVD method, a silicon oxide film formed by an SOG (Spin On Glass) method, or the like can be used. As the organic insulating film, a film made of polyimide, polyamide, BCB (benzocyclobutene), acrylic, a positive photosensitive organic resin, a negative photosensitive organic resin, or the like can be used.

The fourth insulating layer 669 may be made of a material having a skeleton structure formed of a bond of silicon (Si) and oxygen (O). A substituent of this material may be an organic group containing at least hydrogen (such as an alkyl group or an aromatic hydrocarbon) is used for a substituent of this material. Alternatively, the substituent may be a fluoro group. Further alternatively, the substituent may be a fluoro group and an organic group containing at least hydrogen.

The electrode 134 is formed over the fourth insulating layer 669. As the electrode 134, one element selected from Al, Ni, W, Mo, Ti, Pt, Cu, Ta, Au, and Mn, or an alloy containing a plurality of these elements can be used. Alternatively, a single layer structure or a stacked-layer structure made of these elements or the alloy can be used. In the drawings, a single layer structure is shown as an example.

Figure 7A:
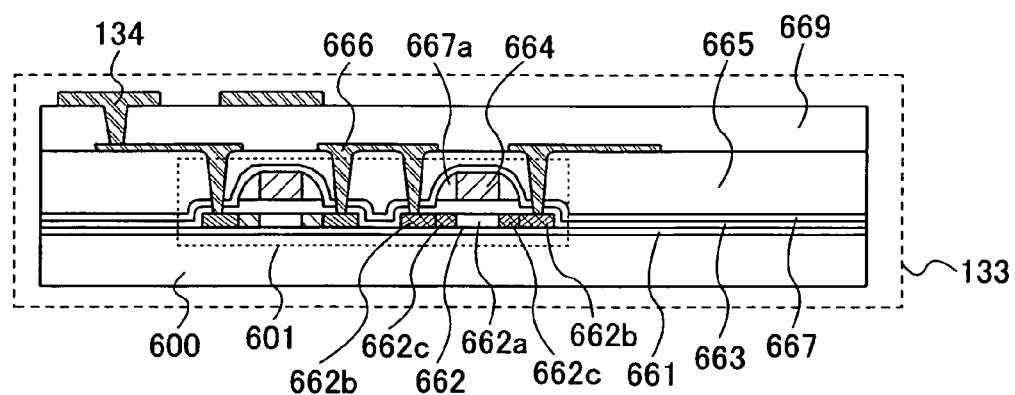
FIGS. 7A and 7B are views each showing a structure of Embodiment 2.
Figure 7B:
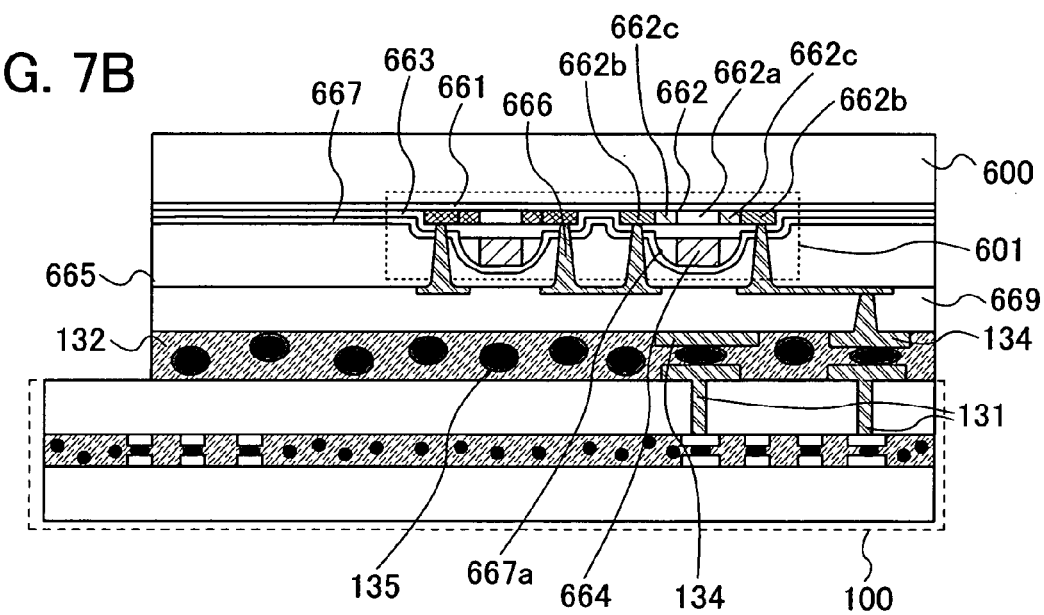

In the structures shown in FIGS. 7A and 7B, the semiconductor integrated circuit 133 can be covered with a film to be sealed. The surface of the film may be coated with silicon dioxide (silica) powder. The coating allows the semiconductor integrated circuit 133 to be kept waterproof even in an environment of high temperature and high humidity. In other words, the semiconductor integrated circuit 133 can have moisture resistance. Moreover, the surface of the film may have an antistatic property. The surface of the film may also be coated with a material containing carbon as its main component (such as diamond like carbon). The coating increases the strength and can prevent the degradation or destruction of a semiconductor device. Alternatively, the film may be formed of a base material (such as resin) mixed with silicon dioxide, a conductive material, or a material containing carbon as its main component. In addition, a surfactant is applied to the surface of the film, or directly added into the film, so that the semiconductor integrated circuit 133 can have an antistatic function.

The structure where the semiconductor integrated circuit 133 and the antenna 100 are electrically connected is similar to that described in Embodiment Mode 4; therefore, description thereof is omitted.

The semiconductor device of the invention can be reduced in cost, and have longer communication distance and higher reliability since the antenna 100 having low resistance and high yield, and high reliability is employed.

This embodiment can be implemented in free combination with any of Embodiment Modes 1 to 4 and Embodiment 1.

EMBODIMENT 3

Description is made of an example of a specific configuration of the semiconductor integrated circuit 133 included in a semiconductor device of the invention, which is other than the structure described in Embodiment 2, and a manufacturing method thereof. In the semiconductor device of a structure shown in FIGS. 7A and 7B in Embodiment 2, the element group 601 formed over the substrate 600 is used as it is; however, the element group 601 formed over the substrate 600 may be peeled from the substrate 600 and attached to a flexible substrate. A method for peeling the element group 601 from the substrate 600 and providing it over the flexible substrate is described with reference to FIGS. 8A to 8G.

Figure 8A:
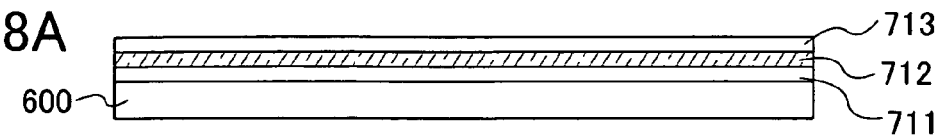
FIGS. 8A to 8G are views each showing a structure of Embodiment 3.

As shown in FIG. 8A, an insulating layer 711, a peeling layer 712, an insulating layer 713 are formed over the substrate 600. As the substrate 600, for example, a glass substrate made of barium borosilicate glass, alumino borosilicate glass, or the like, a quartz substrate, a ceramic substrate, or the like can be used. Alternatively, a semiconductor substrate having the surface over which an insulating film is formed may be used. A flexible substrate made of a synthetic resin such as plastic may also be used. The surface of the substrate may be planarized by polishing using a CMP method or the like. As the insulating layer 711 and the insulating layer 713, an oxide of silicon, a nitride of silicon, an oxide of silicon containing nitrogen, a nitride of silicon containing oxygen, or the like formed by a vapor deposition method (CVD method) or a sputtering method can be used. As the peeling layer 712, a layer containing an element selected from W, Mo, Ti, Ta, Nb, Ni, Co, Zr, Zn, Ru, Rh, Pd, Os, Ir, Si, and the like, an alloy or a compound containing such elements as its main component is formed as a single layer or a stacked layer by a sputtering method or the like. It is to be noted that a layer containing silicon may have any of an amorphous structure, a microcrystalline structure, and a polycrystalline structure.

In a case where the peeling layer 712 has a single layer structure, preferably, a layer containing any of W, Mo, a mixture of W and Mo, an oxide of W, a nitride oxide of W, an oxide of Mo, a nitride oxide of Mo, an oxide of a mixture of W and Mo, and a nitride oxide of a mixture of W and Mo can be used.

In a case where the peeling layer 712 has a stacked layer structure including two layers, a layer containing any of W, Mo, and a mixture of W and Mo can be used as a first layer, and a layer containing any of an oxide of W, a nitride oxide of W, an oxide of Mo, a nitride oxide of Mo, an oxide of a mixture of W and Mo, and a nitride oxide of a mixture of W and Mo can be preferably used as a second layer. These oxides or nitride oxides can be formed by performing oxide plasma treatment or $N_2O$ plasma treatment to the surface of the first layer.

Figure 8B:
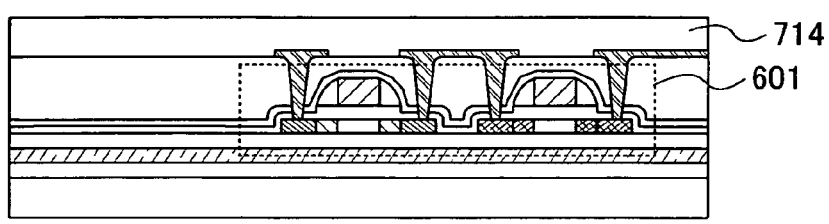

Next, as shown in FIG. 8B, the semiconductor layer 662 is formed over the insulating layer 713, so that the element group 601 is formed. A forming method of the element group 601 is the same as the method described above with reference to FIGS. 7A and 7B; therefore, description thereof is omitted. After the element group 601 is formed, an insulating layer 714 covering the element group 601 is formed. For the insulating layer 714, an insulating resin such as an acrylic resin or a polyimide resin can be used. The insulating layer 714 corresponds to the fourth insulating layer 669. Although not shown in FIG. 8B, an opening portion may be provided in the insulating layer 714 so as to expose a part of the wiring 666, in order to electrically connect the antenna 100 and the element group 601.

Figure 8C:
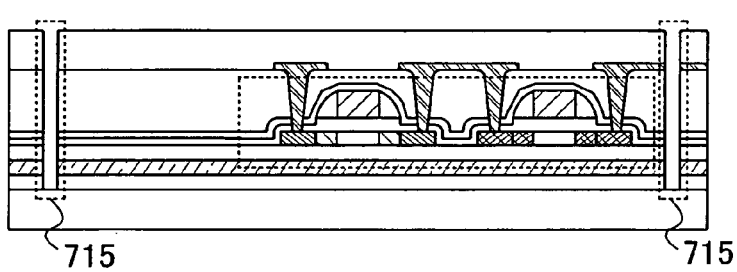

Next, as shown in FIG. 8C, opening portions 715 are formed so as to expose at least part of the peeling layer 712. The opening portions 715 can be formed by laser beam irradiation. As the laser, a solid laser with a wavelength of 150 to 380 nm which is an ultraviolet region can be used.

Figure 8D:
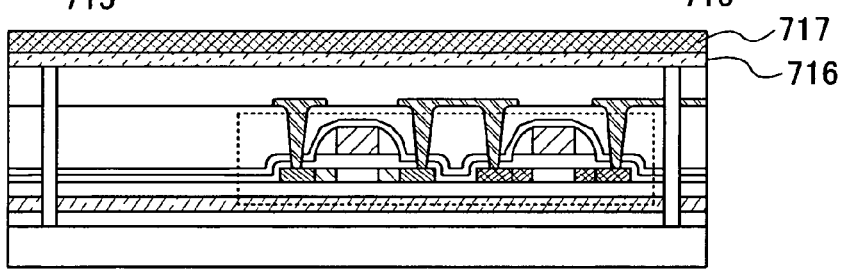

Next, as show in FIG. 8D, a substrate 717 is attached to the insulating layer 714 with an adhesive layer 716.

Figure 8E:
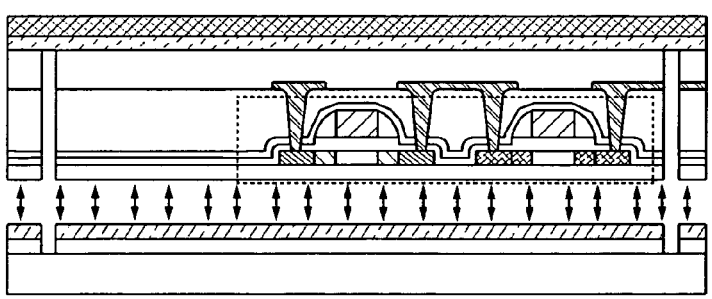

Next, as shown in FIG. 8E, the element group 601 is peeled from the substrate 600. As a method for peeling the element group 601 from the substrate 600, any of the following methods can be used: (A) a method in which the element group 601 is peeled physically by applying stress; (B) a method in which the peeling layer 712 is removed by an etchant; and (C) a method in which the peeling layer 712 is partially removed by an etchant, and then the element group 601 is peeled physically.

Peeling occurs at the interface between the peeling layer 712 and the insulating layer 713 in FIG. 8E; however, the invention is not limited to this, and peeling may occur in the interface between the peeling layer 712 and the insulating layer 711, or the peeling layer 712 itself may be divided into two.

Figure 8F:
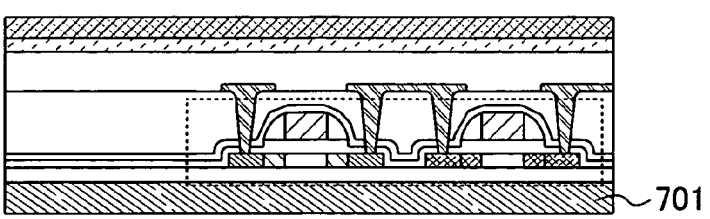

Next, as shown in FIG. 8F, a flexible substrate 701 is attached to the element group 601 with an adhesive. The flexible substrate 701 has flexibility, and a plastic substrate made of polycarbonate, polyarylate, polyether sulfone, or the like can be used. In addition, in order to attach the peeled element group 601 to the flexible substrate 701, a commercial adhesive may be used. For example, an epoxy resin-based adhesive may be used.

Figure 8G:
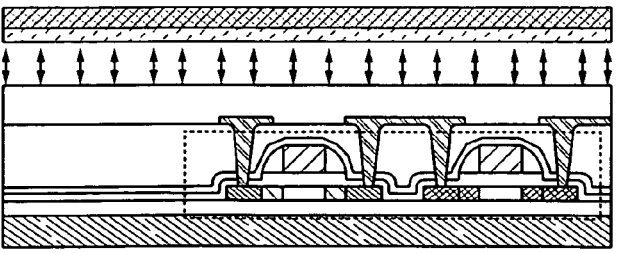

Next, as shown in FIG. 8G after the element group 601 is attached to the flexible substrate 701, the substrate 717 is removed. For example, a layer of which the adhesiveness is reduced by heat treatment may be used for the adhesive layer 716 so that the element group 601 can be peeled from the substrate 717 by performing heat treatment. Thus, the element group 601 can be provided over the flexible substrate 701.

The element group 601 is thus provided over the flexible substrate, whereby a thin and lightweight semiconductor device which is not easily broken even when dropped to the ground, is obtained. When an inexpensive flexible substrate is used, the semiconductor integrated circuit 133 that is inexpensive can be provided.

A method for electrically connecting the semiconductor integrated circuit 133 and the antenna 100 is similar to that described in Embodiment Modes 3 and 4; therefore, description thereof is omitted.

In a structure shown in 8G, the semiconductor integrated circuit 133 can be covered with a film to be sealed. The surface of the film may be coated with silicon dioxide (silica) powder. The coating allows the semiconductor integrated circuit 133 to be kept waterproof in an environment of high temperature and high humidity. In other words, the semiconductor integrated circuit 133 can have moisture resistance. Moreover, the surface of the film may have an antistatic property. The surface of the film may also be coated with a material containing carbon as its main component (such as diamond like carbon). The coating increases the strength and can prevent the degradation or destruction of a semiconductor device. Alternatively, the film may be formed of a base material (for example, resin) mixed with silicon dioxide, a conductive material, or a material containing carbon as its main component. In addition, a surfactant is applied to the surface of the film to coat the surface, or directly added into the film, so that the semiconductor integrated circuit 133 can have an antistatic property.

The semiconductor device of the invention can be reduced in cost, and have longer communication distance and higher reliability since the antenna 100 having low resistance and high yield, and high reliability is employed.

This embodiment can be implemented in free combination with any of Embodiment Modes 1 to 4, and Embodiments 1 and 2.

EMBODIMENT 4

Figure 10A:
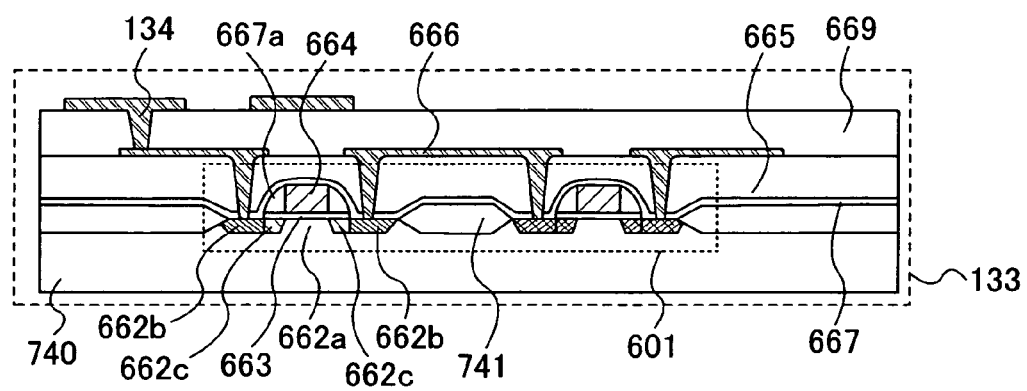
FIGS. 10A and 10B are views each showing a structure of Embodiment 4.
Figure 10B:
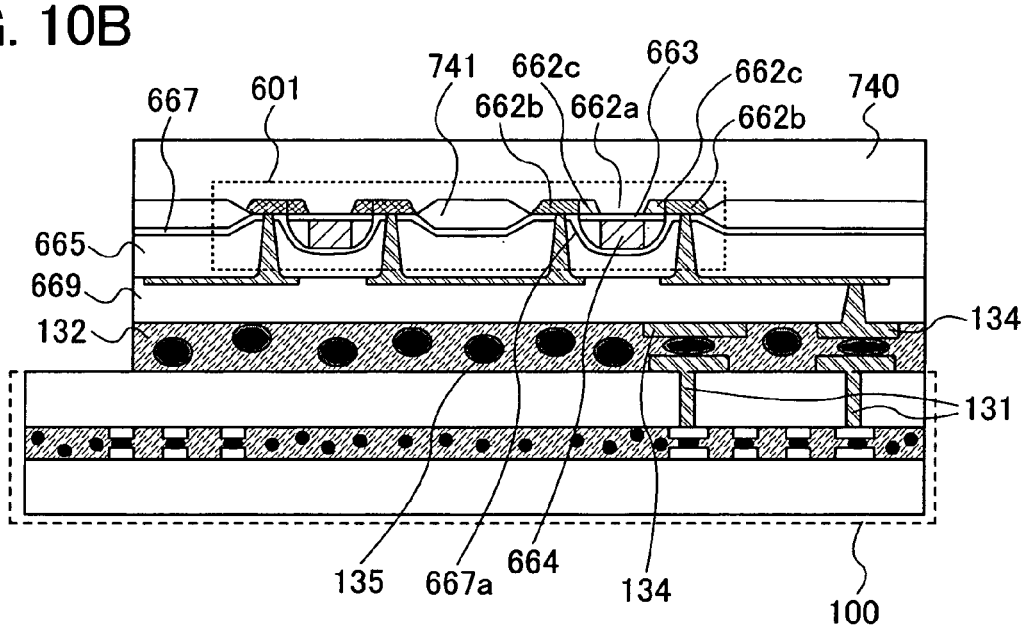
Figure 11A:
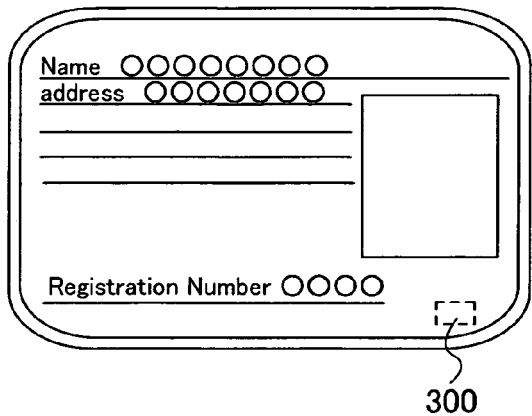
FIGS. 11A to 11E are views each showing a structure of Embodiment 8.
Figure 11B:
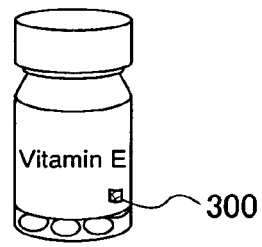
Figure 11C:
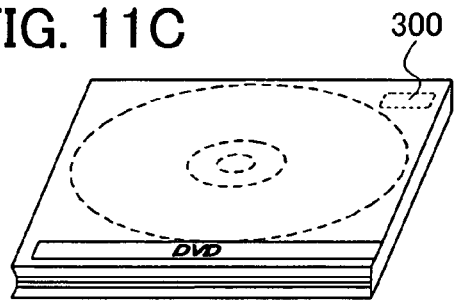
Figure 11D:
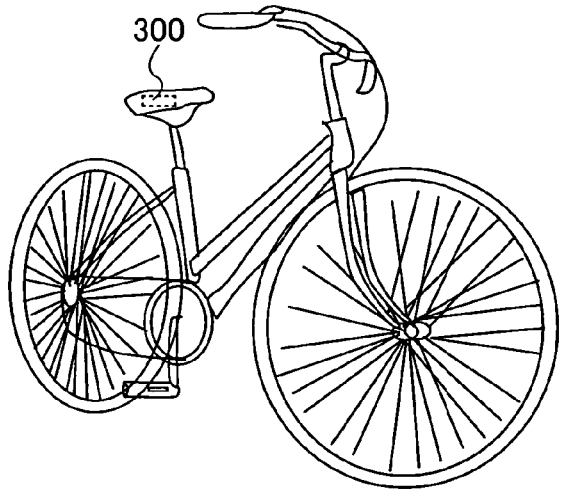
Figure 11E:
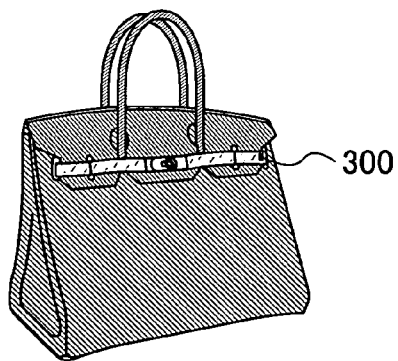

Description is made of an example of a specific structure of the semiconductor integrated circuit 133 included in a semiconductor device of the invention, which is other than the structure described in Embodiment 2 or 3, and a manufacturing method thereof, with reference to FIGS. 10A and 10B. Note that common portions to those in FIGS. 1A to 8G are denoted by the same reference numerals. In Embodiments 2 and 3, a structure where the element group 601 is formed by using a thin film transistor is described. This embodiment is an example where the element group 601 is formed by using a transistor (single crystalline transistor) formed over a semiconductor substrate such as a silicon wafer.

FIG. 10A is an example where a single crystalline transistor is substituted for a thin film transistor in the structure shown in FIG. 7A. FIG. 10B is an example where a single crystalline transistor is substituted for a thin film transistor in the structure shown in FIG. 7B.

An impurity element imparting conductivity is added to a semiconductor substrate 740, whereby the channel forming region 662a, a pair of impurity regions 662b, the low impurity region 662c to which the impurity element is added at a lower concentration than to the impurity region 662b are formed. Further, an insulating layer 741 is provided, which insulates between a plurality of elements. Note that FIGS. 10A and 10B each show a structure having the low concentration impurity region 662c; however, the invention is not limited to this. A structure without the low concentration impurity region 662c may be employed. As the semiconductor substrate 740, for example, a single crystalline silicon substrate having the surface perpendicular to a vicinity of a crystal axis <100> or <110> of single crystalline silicon, which is polished so as to have a thickness of 0.1 μm or more and 20 μm or less, typically, 1 μm or more and 5 μm or less, can be used.

The semiconductor device of the invention can be reduced in cost, and have longer communication distance and higher reliability since the antenna 100 having low resistance and high yield, and high reliability is employed.

This embodiment can be implemented in free combination with any of Embodiment Modes 1 to 4, and Embodiments 1 to 3.

EMBODIMENT 5

In this embodiment, description is made of a semiconductor device to/from which data is inputted/outputted by radio communication through an antenna of the invention (hereinafter referred to as RFID). In addition, a radio communication system using RFID is described.

FIG. 13A shows a structure of a radio communication system including an RFID 3000 and a reader/writer (described as an R/W 2201 in FIG. 13A) for communicating data with the RFID 3000 by radio communication. The RFID 3000 includes an antenna 2202, and a circuit portion 2203 which inputs/outputs signals to/from the antenna 2202. The R/W 2201 includes an antenna 2206 and a circuit portion 2207 which inputs/outputs signals to/from the antenna 2206. The RFID 3000 and the R/W 2201 input/output data by transmitting/receiving a modulated carrier wave (also referred to as a radio signal), using the antenna 2202 and the antenna 2206. The circuit portion 2203 includes an analog portion 2204 and a digital portion 2205. The analog portion 2204 inputs/outputs signals to/from the antenna 2202. The digital portion 2205 inputs/outputs signals to/from the analog portion 2204.

FIG. 13B shows a structure of the analog portion 2204 and the digital portion 2205. The analog portion 2204 includes a resonance capacitor 2501, a pass-band filter 2502, a power source circuit 2503, a demodulation circuit 2506, and a modulation circuit 2507. The resonance capacitor 2501 is provided so that the antenna 2202 can easily receive a signal with a predetermined frequency. The digital portion 2205 includes a code extraction circuit 2301, a code determination circuit 2302, a cyclic redundancy check circuit (described as a CRC circuit 2303 in FIG. 13B), a memory circuit 2305, and a control circuit 2304.

The case where the RFID 3000 receives data is described. A modulated carrier wave inputted from the antenna 2202, from which noise is removed by the pass-band filter 2502, is inputted to the power source circuit 2503 and the demodulation circuit 2506. The power source circuit 2503 has a rectifier circuit and a storage capacitor. The modulated carrier wave inputted through the pass-band filter 2502 is rectified by the rectifier circuit and smoothed by the storage capacitor. Thus, the power source circuit 2503 generates a DC voltage. A DC voltage generated in the power source circuit 2503 is supplied as a power source voltage to each circuit in the circuit portion 2203 included in the RFID 3000. Note that a power source voltage outputted from the power source 2503 may be supplied to each circuit in the circuit portion 2203 through a constant voltage circuit (regulator). The modulated carrier wave inputted through the pass-band filter 2502 is demodulated by the demodulation circuit 2506, and the demodulated signal is inputted to the digital portion 2205. A signal inputted from the analog portion 2204, that is, a signal obtained by demodulating a modulated carrier wave by the demodulation circuit 2506, is inputted to the code extraction circuit 2301, and a code of the signal is extracted. An output of the code extraction circuit 2301 is inputted to the code determination circuit 2302, and the extracted code is analyzed. The analyzed code is inputted to the CRC circuit 2303, and an arithmetic processing for identifying a transmission error is performed. Then, the CRC circuit 2303 outputs to the control circuit 2304 whether the received data signal has an error or not. Note that the RFID 3000 may include a phase synchronization circuit for generating a clock with a predetermined frequency, which is synchronized with a signal by using an output from the demodulation circuit 2506. As a phase synchronization circuit, a Phase Locked Loop circuit (PLL circuit) can be used.

Next, the case where the RFID 3000 transmits data is described. The memory circuit 2305 outputs a stored unique identifier (UID) to the control circuit 2304, in response to a signal inputted from the code determination circuit 2302. The memory circuit 2302 includes a memory and a memory controller for controlling data reading from the memory. As the memory, a mask ROM can be used. The CRC circuit 2303 calculates the CRC code corresponding to the transmitted data and outputs the CRC code to the control circuit 2304. The control circuit 2304 adds the CRC code to the transmitted data signal. The control circuit 2304 encodes the transmitted data to which the CRC code is added. In addition, the control circuit 2304 converts the encoded data into a signal for modulating the carrier wave in accordance with a predetermined modulation method. The output from the control circuit 2304 is inputted to the modulation circuit 2507 of the analog portion 2204. The modulation circuit 2507 load-modulates the carrier wave in response to the inputted signal and outputs the carrier wave to the antenna 2202.

This embodiment mode can be implemented in free combination with any of Embodiment Modes 1 to 4, and Embodiments 1 to 4.

EMBODIMENT 6

In this embodiment, description is made of a manufacturing method of a memory included in the semiconductor integrated circuit 133 of a semiconductor device of the invention (corresponds to a memory included in the memory circuit 2305 in FIGS. 13A and 13B). Here, a mask ROM is used as the memory.

The mask ROM is formed of a plurality of transistors. The transistors constituting the mask ROM can be formed by photolithography. At this time, different data can be written by opening or not opening a contact hole for a wiring connecting to, for example, a drain region of the transistor, in an interlayer insulating film formed over the transistors. For example, data of 1 in the case of opening the contact hole and data of 0 in the case of not opening the contact hole can be written in a memory cell.

A photoresist where the contact hole is to be provided is irradiated with an electronic beam or a laser, before or after a step of exposing the photoresist to light through a reticle (photomask) using a light-exposure apparatus such as a stepper. After that, the steps of developing, etching, peeling the photoresist, and the like are conducted as usual. This makes it possible to independently form a pattern where the contact hole is provided and a pattern where the contact hole is not provided just by selecting regions to be irradiated with an electronic beam or a laser, without changing the reticle (photomask). In other words, by selecting the region to be irradiated with an electronic beam or a laser, a mask ROM in which different data are written for each semiconductor device can be manufactured, without changing the reticle (photomask).

By such a manufacturing method of a mask ROM, a unique identifier (UID) can be set when each semiconductor device is manufactured. In the case of setting a different UID, a reticle (photomask) is not required to be changed; therefore, a semiconductor device can be manufactured at lower cost.

Note that the semiconductor integrated circuit 133 of a semiconductor device of the invention may have a write-once memory or a rewritable memory instead of a mask ROM. Alternatively, the semiconductor integrated circuit 133 may have the mask ROM and both of these memories.

The semiconductor device of the invention can be reduced in cost, and have longer communication distance and higher reliability since the antenna 100 having low resistance and high yield, and high reliability is employed.

This embodiment can be implemented in free combination with any of Embodiment Modes 1 to 4, and Embodiments 1 to 5.

EMBODIMENT 7

In this embodiment, description is made of a carrier wave of radio communication in a semiconductor device (RFID) to/from which data is inputted/outputted by radio communication.

As for the frequency of a carrier wave, any of the following can be employed: a submillimeter wave of 300 GHz or more and 3 THz or less; a millimeter wave of 30 GHz or more and less than 300 GHz; a microwave of 3 GHz or more and less than 30 GHz; an ultrashort wave of 300 MHz or more and less than 3 GHz; a very short wave of 30 MHz or more and less than 300 MHz; a short wave of 3 MHz or more and less than 30 MHz; a medium wave of 300 KHz or more and less than 3 MHz; a long wave of 30 KHz or more and less than 300 KHz; and a very long wave of 3 KHz or more and less than 30 KHz. For example, a carrier wave with the frequency of 13.56 MHz or a carrier wave with the frequency of 2.45 GHz may be used.

A shape of the antenna 100, that is, a shape of the first pattern 102 and the second pattern 104 can be changed in accordance with the frequency of a carrier wave, or a radio communication method. For example, the antenna 100 can have a coil shape in the case of an electromagnetic induction method, whereas a dipole shape in the case of a microwave method.

The semiconductor device of the invention can be reduced in cost, and have longer communication distance and higher reliability since the antenna 100 having low resistance and high yield, and high reliability is employed.

This embodiment can be implemented in free combination with any of Embodiment Modes 1 to 4, and Embodiments 1 to 6.

EMBODIMENT 8

In this embodiment, applications of a semiconductor device of the invention are described with reference to FIGS. 11A to 11E. The semiconductor device 300 of the invention has the antenna 100, and inputs/outputs data by radio communication through the antenna 100. The semiconductor device 300 can be incorporated in, for example, bills; coins; securities; bearer bonds; certificates (such as driving licenses and resident cards, see FIG. 11A); containers for wrapping objects (such as wrapping papers and bottles, see FIG. 11B); recording media such as DVDs, CDs, and video tapes (see FIG. 11C); vehicles such as cars, motorcycles, and bicycles (see FIG. 11D); personal belongings such as bags and glasses (see FIG. 11E); foods; clothes; commodities; electronic appliances, and the like. The electronic appliances include a liquid crystal display device, an EL (electroluminescence) display device, a television set (also simply referred to as a television or a television receiver), a mobile phone, and the like.

The semiconductor device 300 can be fixed to an object by being attached to the surface of the object or embedded in the object. For example, the semiconductor device 300 may be embedded in paper of a book, or an organic resin of a package. The semiconductor device 300 is incorporated in bills, coins, securities, bearer bonds, certificates, and the like, whereby forgery thereof can be prevented. Furthermore, the semiconductor device 300 is incorporated in containers for wrapping objects, recording media, personal belongings, foods, clothes, commodities, electronic appliances, and the like, whereby an inspection system, a rental system, and the like can be performed more efficiently. The semiconductor device 300 can also prevent vehicles from being forged or stolen. In addition, when the semiconductor device 300 is implanted into creatures such as animals, each creature can be identified easily. For example, the semiconductor device 300 is implanted into creatures such as domestic animals, which enables easy identification of the year of birth, sex, breed, and the like thereof.

The semiconductor device 300 of the invention can be reduced in cost, and have longer communication distance and higher reliability since the antenna 100 having low resistance and high yield, and high reliability is employed. Therefore, the semiconductor device 300 can be mounted on various things to be used.

This embodiment can be implemented in free combination with any of Embodiment Modes 1 to 4, and Embodiments 1 to 7.

EMBODIMENT 9

Figure 12A:
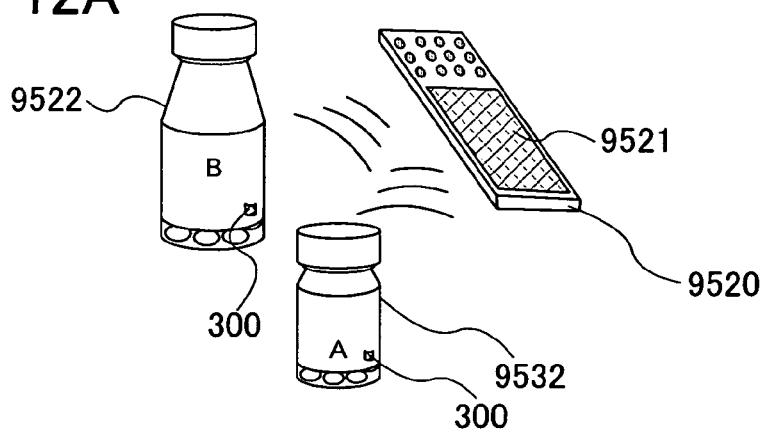
FIGS. 12A to 12C are views each showing a structure of Embodiment 9.
Figure 12B:
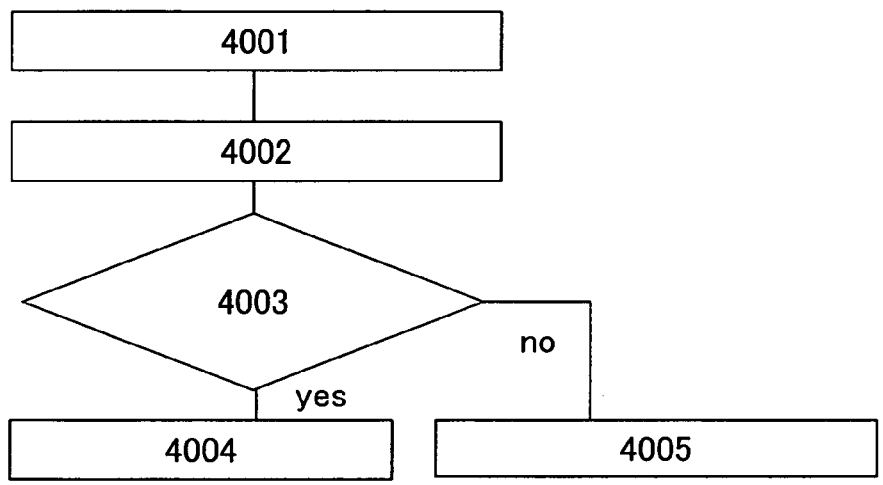

In this embodiment, one mode of a radio communication system using the semiconductor device 300 of the invention is described with reference to FIGS. 12A to 12C. A terminal 9520 including a display portion 9521 is provided with an antenna and a reader/writer connected to the antenna. The semiconductor device 300 of the invention is mounted on an object A 9532 and an object B 9522. FIG. 12A shows oral medicine as an example of the objects A and B. When the antenna of the terminal 9520 is brought close to the semiconductor device 300 included in the object A 9532, data on the object A 9522, such as ingredients, place of origin, test result in each production step, history of the distribution process, and explanation of the object is displayed on the display portion 9521. When the terminal 9520 is brought close to the semiconductor device 300 included in the object B 9522, data on the object B 9522, such as ingredients, place of origin, test result in each production step, history of the distribution process, and explanation of the object is displayed on the display portion 9521.

An example of a business model utilizing the system shown in FIG. 12A is described with reference to a flow chart shown in FIG. 12B. Data on allergy is inputted to the terminal 9520 (first step 4001). The data on allergy is data on medical products, their components, or the like that may cause allergic reactions to certain people. As described above, data on oral medicine A which is the object A 9532 is obtained by the antenna mounted on the terminal 9520 (second step 4002). The data on the oral medicine A includes data on the components and the like of the oral medicine A. The data on allergy is compared to the obtained data on components and the like of the oral medicine A, whereby whether corresponding components are contained or not is determined (third step 4003). If the corresponding components are contained, the user of the terminal 9520 is alerted that certain people may have allergic reactions to the oral medicine A (fourth step 4004). If the corresponding components are not contained, the user of the terminal 9520 is informed that certain people are at low risk of having allergic reactions to the oral medicine A (that the oral medicine A is safe) (fifth step 4005). In the fourth step 4004 and the fifth step 4005, in order to inform the user of the terminal 9520, the data may be displayed on the display portion 9521 of the terminal 9520, or an alarm of the terminal 9520 or the like may be turned on.

Figure 12C:
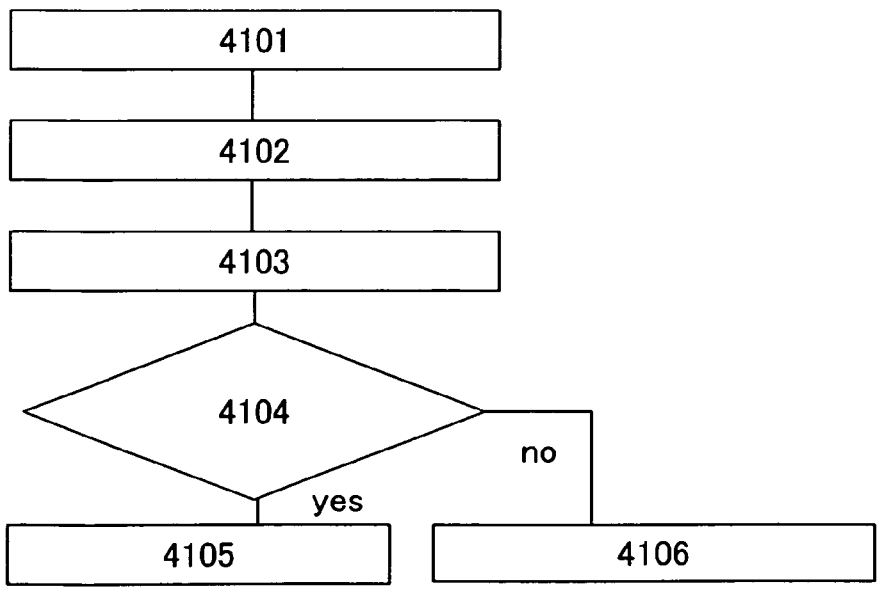

Next, another example of a business model is shown in FIG. 12C. Data on combinations of oral medicine which are dangerous when taken together or combinations of components of oral medicine which are dangerous when taken together (hereinafter simply referred to as combination data) is inputted to the terminal 9520 (first step 4101). As described above, data on the oral medicine A which is the object A 9532 is obtained by the antenna mounted on the terminal 9520 (second step 4102). The data on the oral medicine A includes data on components and the like of the oral medicine A. Subsequently, as described above, data on the oral medicine B which is the object B is obtained by the antenna mounted on the terminal 9520 (third step 4103). The data on the oral medicine B includes data on components and the like of the oral medicine B. In this way, data of a plurality of oral medicine is obtained. The combination data is compared to the obtained data of a plurality of oral medicine, whereby whether or not a corresponding combination of medical products which are dangerous when taken together is contained is determined (fourth step 4104). If the corresponding combination is contained, the user of the terminal 9520 is alerted (fifth step 4105). If the corresponding combination is not contained, the user of the terminal 9520 is informed of the safety (sixth step 4106). In the fifth step 4105 and the sixth step 4106, in order to inform the user of the terminal 9520, the data may be displayed on the display portion 9521 of the terminal 9520, or an alarm of the terminal 9520 or the like may be sounded.

The semiconductor device of the invention can be reduced in cost, and have longer communication distance and higher reliability. Therefore, an application range of a radio communication system can be expanded when the invention is applied to a radio communication system using the semiconductor device.

This embodiment can be implemented in free combination with any of Embodiment Modes 1 to 4, and Embodiments 1 to 8.

This application is based on Japanese Patent Application serial no. 2005-343012 filed in Japan Patent Office on 29th, Nov., 2005, the entire contents of which are hereby incorporated by reference.

The invention claimed is:

1. An antenna comprising:
a first substrate having a first insulating surface;
a first pattern comprising a first conductive material over the first insulating surface;
a second substrate having a second insulating surface, the second substrate provided so as to face the first insulating surface;
a second pattern comprising a second conductive material, over the second insulating surface;
a third substrate over the second substrate;
a conductive film between the second substrate and the third substrate; and an anisotropic conductive material and a conductive particle provided between the first pattern and the second pattern, the anisotropic conductive material and the conductive particle electrically connecting the first pattern and the second pattern, wherein the second substrate has a contact hole, wherein the second pattern is electrically connected to the conductive film through the contact hole, wherein the first pattern and the second pattern have the same shape, and wherein the first pattern and the second pattern are arranged so as to overlap with each other.

2. The antenna according to claim 1, wherein the anisotropic conductive material is arranged so as to cover all over at least one of the first insulating surface and the second insulating surface.

3. The antenna according to claim 1, wherein the first pattern and the second pattern each have a coil shape.

4. The antenna according to claim 1, wherein each of the first conductive material and the second conductive material comprises at least one selected group consisting of Ag, Au, Al, Cu, Zn, Sn, Ni, Cr, Fe, Co, and Ti.

5. The antenna according to claim 1, wherein the first substrate and the second substrate are flexible.

6. The antenna according to claim 1, wherein each of the first substrate and the second substrate comprises a plastic.

7. The antenna according to claim 1, wherein each of the first substrate and the second substrate comprises a material selected from the group consisting of polyethylene terephthalate, polyether sulfone, polyethylene naphthalate, polycarbonate, nylon, polyetheretherketone, polysulfone, polyether imide, polyarylate, polybutylene terephthalate, and polyimide.

8. An antenna comprising:
a first substrate having a first insulating surface;
a first pattern comprising a first conductive material over the first insulating surface;
a second substrate having a second insulating surface, is the second substrate provided so as to face the first insulating surface;
a second pattern comprising a second conductive material, over the second insulating surface;
a third substrate over the second substrate;
a conductive film between the second substrate and the third substrate; and
an anisotropic conductive material and a conductive particle provided between the first pattern and the second pattern, the anisotropic conductive material and the conductive particle electrically connecting the first pattern and the second pattern, wherein the second substrate has a contact hole, wherein the second pattern is electrically connected to the conductive film through the contact hole, wherein a whole region of the first pattern overlaps with the second pattern with the anisotropic conductive material and the conductive particle interposed therebetween.

9. The antenna according to claim 8, wherein the anisotropic conductive material is arranged so as to cover all over at least one of the first insulating surface and the second insulating surface.

10. The antenna according to claim 8, wherein the first pattern and the second pattern each have a coil shape.

11. The antenna according to claim 8, wherein each of the first conductive material and the second conductive material comprises at least one selected group consisting of Ag, Au, Al, Cu, Zn, Sn, Ni, Cr, Fe, Co, and Ti.

12. The antenna according to claim 8, wherein the first substrate and the second substrate are flexible.

13. The antenna according to claim 8, wherein each of the first substrate and the second substrate comprises a plastic.

14. The antenna according to claim 8, wherein each of the first substrate and the second substrate comprises a material selected from the group consisting of polyethylene terephthalate, polyether sulfone, polyethylene naphthalate, polycarbonate, nylon, polyetheretherketone, polysulfone, polyether imide, polyarylate, polybutylene terephthalate, and polyimide.

15. An antenna comprising:
a first substrate having a first insulating surface;
a first pattern comprising a first conductive material over the first insulating surface;
a second substrate having a second insulating surface, is the second substrate provided so as to face the first insulating surface;
a second pattern comprising a second conductive material, over the second insulating surface;
a third substrate over the second substrate;
a conductive film between the second substrate and the third substrate; and
an anisotropic conductive material and a conductive particle provided between the first pattern and the second pattern, the anisotropic conductive material and the conductive particle electrically connecting the first pattern and the second pattern, wherein the second substrate has a contact hole, wherein the second pattern is electrically connected to the conductive film through the contact hole, wherein a whole region of the first pattern overlaps with the second pattern with the anisotropic conductive material and the conductive particle interposed therebetween, and wherein a whole region of the second pattern overlaps with the first pattern with the anisotropic conductive material and the conductive particle interposed therebetween.

16. The antenna according to claim 15, wherein the anisotropic conductive material is arranged so as to cover all over at least one of the first insulating surface and the second insulating surface.

17. The antenna according to claim 15, wherein the first pattern and the second pattern each have a coil shape.

18. The antenna according to claim 15, wherein each of the first conductive material and the second conductive material comprises at least one selected group consisting of Ag, Au, Al, Cu, Zn, Sn, Ni, Cr, Fe, Co, and Ti.

19. The antenna according to claim 15, wherein the first substrate and the second substrate are flexible.

20. The antenna according to claim 15, wherein each of the first substrate and the second substrate comprises a plastic.

21. The antenna according to claim 15, wherein each of the first substrate and the second substrate comprises a material selected from the group consisting of polyethylene terephthalate, polyether sulfone, polyethylene naphthalate, polycarbonate, nylon, polyetheretherketone, polysulfone, polyether imide, polyarylate, polybutylene terephthalate, and polyimide.

22. An antenna comprising:
a first substrate having a first insulating surface;
a first pattern comprising a first conductive material over the first insulating surface;
a second substrate having a second insulating surface, is the second substrate provided so as to face the first insulating surface;

a second pattern comprising a second conductive material over the second insulating surface;

a third substrate over the second substrate;

a conductive film between the second substrate and the third substrate; and an anisotropic conductive material and a conductive particle provided between the first pattern and the second pattern, the anisotropic conductive material and the conductive particle electrically connecting the first pattern and the second pattern, wherein the second substrate has a contact hole, wherein the second pattern is electrically connected to the conductive film through the contact hole, wherein a whole region of the first pattern overlaps with the second pattern with the anisotropic conductive material and the conductive particle interposed therebetween; and wherein the first pattern and the second pattern have the same shape.

23. The antenna according to claim 22, wherein the anisotropic conductive material is arranged so as to cover all over at least one of the first insulating surface and the second insulating surface.

24. The antenna according to claim 22, wherein the first pattern and the second pattern each have a coil shape.

25. The antenna according to claim 22, wherein each of the first conductive material and the second conductive material comprises at least one selected group consisting of Ag, Au, Al, Cu, Zn, Sn, Ni, Cr, Fe, Co, and Ti.

26. The antenna according to claim 22, wherein the first substrate and the second substrate are flexible.

27. The antenna according to claim 22, wherein each of the first substrate and the second substrate comprises a plastic.

28. The antenna according to claim 22, wherein each of the first substrate and the second substrate comprises a material selected from the group consisting of polyethylene terephthalate, polyether sulfone, polyethylene naphthalate, polycarbonate, nylon, polyetheretherketone, polysulfone, polyether imide, polyarylate, polybutylene terephthalate, and polyimide.

* * * * *